US008060774B2

(12) United States Patent
Smith et al.

(10) Patent No.: US 8,060,774 B2
(45) Date of Patent: Nov. 15, 2011

(54) MEMORY SYSTEMS AND MEMORY MODULES

(75) Inventors: Michael John Sebastian Smith, Palo Alto, CA (US); Suresh Natarajan Rajan, San Jose, CA (US)

(73) Assignee: Google Inc., Mountain View, CA (US)

( * ) Notice: Subject to any disclaimer, the term of this patent is extended or adjusted under 35 U.S.C. 154(b) by 457 days.

(21) Appl. No.: 11/763,365

(22) Filed: Jun. 14, 2007

(65) Prior Publication Data

US 2008/0010435 A1 Jan. 10, 2008

Related U.S. Application Data

(63) Continuation-in-part of application No. 11/474,076, filed on Jun. 23, 2006, and a continuation-in-part of application No. 11/515,223, filed on Sep. 1, 2006.

(60) Provisional application No. 60/693,631, filed on Jun. 24, 2005, provisional application No. 60/713,815, filed on Sep. 2, 2005, provisional application No. 60/814,234, filed on Jun. 16, 2006.

(51) Int. Cl.
*G06F 11/00* (2006.01)
(52) U.S. Cl. ..................... 714/5; 714/7; 714/8
(58) Field of Classification Search ............ 714/42, 714/7–8, 710
See application file for complete search history.

(56) References Cited

U.S. PATENT DOCUMENTS

| | | | |
|---|---|---|---|
| 3,800,292 A | 3/1974 | Curley et al. | |
| 4,069,452 A | 1/1978 | Conway et al. | |
| 4,323,965 A | 4/1982 | Johnson et al. | |
| 4,334,307 A * | 6/1982 | Bourgeois et al. | 714/45 |
| 4,345,319 A * | 8/1982 | Bernardini et al. | 365/189.02 |
| 4,392,212 A | 7/1983 | Miyasaka et al. | 365/230 |
| 4,525,921 A | 7/1985 | Carson et al. | |
| 4,566,082 A | 1/1986 | Anderson | |
| 4,592,019 A | 5/1986 | Huang et al. | |
| 4,646,128 A | 2/1987 | Carson et al. | |

(Continued)

FOREIGN PATENT DOCUMENTS

DE 102004051345 5/2006

(Continued)

OTHER PUBLICATIONS

Non-final Office Action from U.S. Appl. No. 11/461,430 mailed on Feb. 19, 2009.

(Continued)

*Primary Examiner* — Scott T Baderman
*Assistant Examiner* — Kamini Patel
(74) *Attorney, Agent, or Firm* — Fish & Richardson P.C.

(57) ABSTRACT

One embodiment of the present invention sets forth a memory module that includes at least one memory chip, and an intelligent chip coupled to the at least one memory chip and a memory controller, where the intelligent chip is configured to implement at least a part of a RAS feature. The disclosed architecture allows one or more RAS features to be implemented locally to the memory module using one or more intelligent register chips, one or more intelligent buffer chips, or some combination thereof. Such an approach not only increases the effectiveness of certain RAS features that were available in prior art systems, but also enables the implementation of certain RAS features that were not available in prior art systems.

51 Claims, 11 Drawing Sheets

U.S. PATENT DOCUMENTS

| | | | |
|---|---|---|---|
| 4,698,748 A | 10/1987 | Juzswik et al. | |
| 4,706,166 A | 11/1987 | Go | |
| 4,710,903 A | 12/1987 | Hereth et al. | |
| 4,764,846 A | 8/1988 | Go | |
| 4,780,843 A | 10/1988 | Tietjen | |
| 4,794,597 A * | 12/1988 | Ooba et al. | 714/703 |
| 4,796,232 A | 1/1989 | House | 365/189 |
| 4,841,440 A | 6/1989 | Yonezu et al. | |
| 4,862,347 A | 8/1989 | Rudy | |
| 4,884,237 A | 11/1989 | Mueller et al. | |
| 4,887,240 A | 12/1989 | Garverick et al. | 361/222 |
| 4,888,687 A | 12/1989 | Allison et al. | |
| 4,899,107 A | 2/1990 | Corbett et al. | |
| 4,912,678 A | 3/1990 | Mashiko | |
| 4,922,451 A * | 5/1990 | Lo et al. | 714/8 |
| 4,935,734 A | 6/1990 | Austin | |
| 4,937,791 A | 6/1990 | Steele et al. | |
| 4,956,694 A | 9/1990 | Eide | |
| 4,982,265 A | 1/1991 | Watanabe et al. | |
| 4,983,533 A | 1/1991 | Go | |
| 5,025,364 A | 6/1991 | Zellmer | |
| 5,072,424 A | 12/1991 | Brent et al. | 365/189 |
| 5,083,266 A | 1/1992 | Watanabe | |
| 5,104,820 A | 4/1992 | Go et al. | |
| 5,220,672 A | 6/1993 | Nakao et al. | |
| 5,241,266 A | 8/1993 | Ahmad et al. | |
| 5,252,807 A | 10/1993 | Chizinsky | |
| 5,257,233 A | 10/1993 | Schaefer | |
| 5,278,796 A | 1/1994 | Tillinghast et al. | |
| 5,282,177 A | 1/1994 | McLaury | |
| 5,332,922 A | 7/1994 | Oguchi et al. | 257/723 |
| 5,347,428 A | 9/1994 | Carson et al. | |
| 5,384,745 A | 1/1995 | Konishi et al. | |
| 5,388,265 A | 2/1995 | Volk | |
| 5,390,334 A | 2/1995 | Harrison | |
| 5,408,190 A | 4/1995 | Wood et al. | |
| 5,432,729 A | 7/1995 | Carson et al. | |
| 5,448,511 A | 9/1995 | Paurus et al. | |
| 5,453,434 A | 9/1995 | Albaugh et al. | |
| 5,467,455 A | 11/1995 | Gay et al. | |
| 5,483,497 A | 1/1996 | Mochizuki et al. | |
| 5,498,886 A | 3/1996 | Hsu et al. | 257/213 |
| 5,502,333 A | 3/1996 | Bertin et al. | |
| 5,502,667 A | 3/1996 | Bertin et al. | |
| 5,513,135 A * | 4/1996 | Dell et al. | 365/52 |
| 5,513,339 A | 4/1996 | Agrawal et al. | |
| 5,519,832 A * | 5/1996 | Warchol | 714/46 |
| 5,526,320 A | 6/1996 | Zagar et al. | |
| 5,530,836 A | 6/1996 | Busch et al. | |
| 5,550,781 A | 8/1996 | Sugawara et al. | |
| 5,559,990 A | 9/1996 | Cheng et al. | |
| 5,561,622 A | 10/1996 | Bertin et al. | |
| 5,563,086 A | 10/1996 | Bertin et al. | |
| 5,566,344 A | 10/1996 | Hall et al. | |
| 5,581,498 A | 12/1996 | Ludwig et al. | |
| 5,581,779 A | 12/1996 | Hall et al. | |
| 5,590,071 A | 12/1996 | Kolor et al. | |
| 5,598,376 A | 1/1997 | Merritt et al. | |
| 5,604,714 A | 2/1997 | Manning et al. | |
| 5,606,710 A | 2/1997 | Hall et al. | |
| 5,608,262 A | 3/1997 | Degani et al. | |
| 5,610,864 A | 3/1997 | Manning | |
| 5,623,686 A | 4/1997 | Hall et al. | |
| 5,627,791 A | 5/1997 | Wright et al. | |
| 5,640,337 A | 6/1997 | Huang et al. | |
| 5,640,364 A | 6/1997 | Merritt et al. | |
| 5,652,724 A | 7/1997 | Manning | |
| 5,654,204 A | 8/1997 | Anderson | |
| 5,661,677 A | 8/1997 | Rondeau et al. | |
| 5,661,695 A | 8/1997 | Zagar et al. | |
| 5,668,773 A | 9/1997 | Zagar et al. | |
| 5,675,549 A | 10/1997 | Ong et al. | |
| 5,680,342 A | 10/1997 | Frankeny | |
| 5,682,354 A | 10/1997 | Manning | |
| 5,692,121 A * | 11/1997 | Bozso et al. | 714/13 |
| 5,692,202 A | 11/1997 | Kardach et al. | |
| 5,696,732 A | 12/1997 | Zagar et al. | |
| 5,702,984 A | 12/1997 | Bertin et al. | |
| 5,703,813 A | 12/1997 | Manning et al. | |
| 5,706,247 A | 1/1998 | Merritt et al. | |
| RE35,733 E | 2/1998 | Hernandez et al. | |
| 5,717,654 A | 2/1998 | Manning | |
| 5,721,859 A | 2/1998 | Manning | |
| 5,724,288 A | 3/1998 | Cloud et al. | |
| 5,729,503 A | 3/1998 | Manning | |
| 5,729,504 A | 3/1998 | Cowles | 365/236 |
| 5,742,792 A * | 4/1998 | Yanai et al. | 711/162 |
| 5,748,914 A | 5/1998 | Barth et al. | |
| 5,752,045 A | 5/1998 | Chen | |
| 5,757,703 A | 5/1998 | Merritt et al. | |
| 5,760,478 A | 6/1998 | Bozso et al. | |
| 5,761,703 A | 6/1998 | Bolyn | 711/106 |
| 5,781,766 A | 7/1998 | Davis | |
| 5,787,457 A | 7/1998 | Miller et al. | |
| 5,798,961 A | 8/1998 | Heyden et al. | |
| 5,802,010 A | 9/1998 | Zagar et al. | |
| 5,802,395 A | 9/1998 | Connolly et al. | |
| 5,802,555 A | 9/1998 | Shigeeda | 711/106 |
| 5,812,488 A | 9/1998 | Zagar et al. | |
| 5,831,833 A | 11/1998 | Shirakawa et al. | |
| 5,831,931 A | 11/1998 | Manning | |
| 5,831,932 A | 11/1998 | Merritt et al. | |
| 5,834,838 A | 11/1998 | Anderson | |
| 5,835,435 A | 11/1998 | Bogin et al. | |
| 5,838,165 A | 11/1998 | Chatter | |
| 5,838,177 A | 11/1998 | Keeth | |
| 5,841,580 A | 11/1998 | Farmwald et al. | 365/194 |
| 5,843,799 A | 12/1998 | Hsu et al. | 438/6 |
| 5,843,807 A | 12/1998 | Burns | |
| 5,845,108 A | 12/1998 | Yoo et al. | |
| 5,850,368 A | 12/1998 | Ong et al. | |
| 5,859,792 A | 1/1999 | Rondeau, II et al. | |
| 5,860,106 A | 1/1999 | Domen et al. | |
| 5,870,347 A | 2/1999 | Keeth et al. | |
| 5,870,350 A | 2/1999 | Bertin et al. | |
| 5,872,907 A * | 2/1999 | Griess et al. | 714/17 |
| 5,875,142 A | 2/1999 | Chevallier | |
| 5,878,279 A | 3/1999 | Athenes | |
| 5,884,088 A | 3/1999 | Kardach et al. | |
| 5,901,105 A | 5/1999 | Ong et al. | |
| 5,903,500 A | 5/1999 | Tsang et al. | |
| 5,905,688 A | 5/1999 | Park | |
| 5,907,512 A | 5/1999 | Parkinson et al. | |
| 5,915,105 A | 6/1999 | Farmwald et al. | |
| 5,915,167 A | 6/1999 | Leedy | |
| 5,917,758 A | 6/1999 | Keeth | |
| 5,923,611 A | 7/1999 | Ryan | |
| 5,924,111 A | 7/1999 | Huang et al. | |
| 5,926,435 A | 7/1999 | Park et al. | |
| 5,929,650 A | 7/1999 | Pappert et al. | |
| 5,943,254 A | 8/1999 | Bakeman, Jr. et al. | |
| 5,946,265 A | 8/1999 | Cowles | |
| 5,949,254 A | 9/1999 | Keeth | |
| 5,953,215 A | 9/1999 | Karabatsos | |
| 5,953,263 A | 9/1999 | Farmwald et al. | |
| 5,954,804 A | 9/1999 | Farmwald et al. | |
| 5,956,233 A | 9/1999 | Yew et al. | |
| 5,963,429 A | 10/1999 | Chen | |
| 5,963,463 A | 10/1999 | Rondeau, II et al. | |
| 5,963,464 A | 10/1999 | Dell et al. | |
| 5,963,504 A | 10/1999 | Manning | |
| 5,966,724 A | 10/1999 | Ryan | |
| 5,966,727 A | 10/1999 | Nishino | |
| 5,969,996 A | 10/1999 | Muranaka et al. | 365/189.01 |
| 5,973,392 A | 10/1999 | Senba et al. | |
| 5,995,424 A * | 11/1999 | Lawrence et al. | 365/201 |
| 5,995,443 A | 11/1999 | Farmwald et al. | |
| 6,001,671 A | 12/1999 | Fjelstad | |
| 6,002,613 A | 12/1999 | Cloud et al. | |
| 6,002,627 A | 12/1999 | Chevallier | |
| 6,014,339 A | 1/2000 | Kobayashi et al. | |
| 6,016,282 A | 1/2000 | Keeth | |
| 6,026,050 A | 2/2000 | Baker et al. | 365/233 |
| 6,029,250 A | 2/2000 | Keeth | 713/400 |
| 6,032,214 A | 2/2000 | Farmwald et al. | |
| 6,032,215 A | 2/2000 | Farmwald et al. | |
| 6,034,916 A | 3/2000 | Lee | |

| | | | |
|---|---|---|---|
| 6,034,918 A | 3/2000 | Farmwald et al. | |
| 6,035,365 A | 3/2000 | Farmwald et al. | |
| 6,038,195 A | 3/2000 | Farmwald et al. | |
| 6,038,673 A | 3/2000 | Benn et al. | |
| 6,044,032 A | 3/2000 | Li | |
| 6,047,073 A * | 4/2000 | Norris et al. | 381/61 |
| 6,047,344 A | 4/2000 | Kawasumi et al. | |
| 6,053,948 A | 4/2000 | Vaidyanathan et al. | 703/14 |
| 6,069,504 A | 5/2000 | Keeth | |
| 6,070,217 A | 5/2000 | Connolly et al. | |
| 6,073,223 A | 6/2000 | McAllister et al. | |
| 6,075,730 A | 6/2000 | Barth et al. | |
| 6,075,744 A | 6/2000 | Tsern et al. | 365/230 |
| 6,078,546 A | 6/2000 | Lee | |
| 6,079,025 A | 6/2000 | Fung | |
| 6,084,434 A | 7/2000 | Keeth | |
| 6,088,290 A | 7/2000 | Ohtake et al. | |
| 6,091,251 A | 7/2000 | Wood et al. | |
| RE36,839 E | 8/2000 | Simmons et al. | |
| 6,101,152 A | 8/2000 | Farmwald et al. | |
| 6,101,564 A | 8/2000 | Athenes et al. | |
| 6,101,612 A | 8/2000 | Jeddeloh | |
| 6,108,795 A | 8/2000 | Jeddeloh | |
| 6,111,812 A | 8/2000 | Gans et al. | 365/233 |
| 6,134,638 A | 10/2000 | Olarig et al. | 711/167 |
| 6,154,370 A | 11/2000 | Degani et al. | |
| 6,166,991 A | 12/2000 | Phelan | |
| 6,182,184 B1 | 1/2001 | Farmwald et al. | |
| 6,199,151 B1 | 3/2001 | Williams et al. | |
| 6,208,168 B1 | 3/2001 | Rhee | |
| 6,216,246 B1 | 4/2001 | Shau | 714/763 |
| 6,222,739 B1 | 4/2001 | Bhakta et al. | |
| 6,226,709 B1 | 5/2001 | Goodwin et al. | |
| 6,233,192 B1 | 5/2001 | Tanaka | |
| 6,233,650 B1 | 5/2001 | Johnson et al. | |
| 6,240,048 B1 | 5/2001 | Matsubara | |
| 6,243,282 B1 | 6/2001 | Rondeau et al. | |
| 6,252,807 B1 | 6/2001 | Suzuki et al. | |
| 6,260,097 B1 | 7/2001 | Farmwald et al. | |
| 6,260,154 B1 | 7/2001 | Jeddeloh | |
| 6,262,938 B1 | 7/2001 | Lee et al. | |
| 6,266,285 B1 | 7/2001 | Farmwald et al. | |
| 6,266,292 B1 | 7/2001 | Tsern et al. | 365/230 |
| 6,274,395 B1 | 8/2001 | Weber | |
| 6,279,069 B1 | 8/2001 | Robinson et al. | 711/103 |
| 6,295,572 B1 | 9/2001 | Wu | |
| 6,298,426 B1 | 10/2001 | Ajanovic | |
| 6,304,511 B1 | 10/2001 | Gans et al. | 365/233 |
| 6,307,769 B1 | 10/2001 | Nuxoll et al. | |
| 6,314,051 B1 | 11/2001 | Farmwald et al. | |
| 6,317,352 B1 | 11/2001 | Halbert et al. | 365/52 |
| 6,317,381 B1 | 11/2001 | Gans et al. | 365/233 |
| 6,324,120 B2 | 11/2001 | Farmwald et al. | |
| 6,326,810 B1 | 12/2001 | Keeth | |
| 6,327,664 B1 | 12/2001 | Dell et al. | |
| 6,330,683 B1 | 12/2001 | Jeddeloh | |
| 6,336,174 B1 | 1/2002 | Li et al. | |
| 6,338,108 B1 | 1/2002 | Motomura | |
| 6,338,113 B1 | 1/2002 | Kubo et al. | |
| 6,341,347 B1 | 1/2002 | Joy et al. | 712/228 |
| 6,343,042 B1 | 1/2002 | Tsern et al. | 365/222 |
| 6,353,561 B1 | 3/2002 | Funyu et al. | |
| 6,356,105 B1 | 3/2002 | Volk | |
| 6,356,500 B1 | 3/2002 | Cloud et al. | |
| 6,362,656 B2 | 3/2002 | Rhee | |
| 6,363,031 B2 | 3/2002 | Phelan | |
| 6,378,020 B2 | 4/2002 | Farmwald et al. | |
| 6,381,188 B1 | 4/2002 | Choi et al. | |
| 6,381,668 B1 | 4/2002 | Lunteren | |
| 6,389,514 B1 | 5/2002 | Rokicki | |
| 6,392,304 B1 | 5/2002 | Butler | |
| 6,414,868 B1 | 7/2002 | Wong et al. | 365/51 |
| 6,418,034 B1 | 7/2002 | Weber et al. | |
| 6,421,754 B1 | 7/2002 | Kau et al. | |
| 6,424,532 B2 | 7/2002 | Kawamura | |
| 6,426,916 B2 | 7/2002 | Farmwald et al. | |
| 6,429,029 B1 | 8/2002 | Eldridge et al. | |
| 6,430,103 B2 | 8/2002 | Nakayama et al. | |
| 6,437,600 B1 | 8/2002 | Keeth | |
| 6,438,057 B1 | 8/2002 | Ruckerbauer | |
| 6,442,698 B2 | 8/2002 | Nizar | |
| 6,445,591 B1 | 9/2002 | Kwong | |
| 6,452,826 B1 | 9/2002 | Kim et al. | |
| 6,452,863 B2 | 9/2002 | Farmwald et al. | |
| 6,453,400 B1 | 9/2002 | Maesako et al. | |
| 6,453,402 B1 | 9/2002 | Jeddeloh | 711/167 |
| 6,453,434 B2 | 9/2002 | Delp et al. | |
| 6,455,348 B1 | 9/2002 | Yamaguchi | |
| 6,457,095 B1 | 9/2002 | Volk | |
| 6,459,651 B1 | 10/2002 | Lee et al. | |
| 6,473,831 B1 | 10/2002 | Schade | |
| 6,476,476 B1 | 11/2002 | Glenn | |
| 6,480,929 B1 | 11/2002 | Gauthier et al. | |
| 6,487,102 B1 | 11/2002 | Halbert et al. | |
| 6,489,669 B2 | 12/2002 | Shimada et al. | |
| 6,490,161 B1 | 12/2002 | Johnson | |
| 6,493,789 B2 | 12/2002 | Ware et al. | |
| 6,496,440 B2 | 12/2002 | Manning | |
| 6,496,897 B2 | 12/2002 | Ware et al. | |
| 6,498,766 B2 | 12/2002 | Lee et al. | 365/233 |
| 6,510,097 B2 | 1/2003 | Fukuyama | |
| 6,510,503 B2 | 1/2003 | Gillingham et al. | |
| 6,512,392 B2 | 1/2003 | Fleury et al. | |
| 6,521,984 B2 | 2/2003 | Matsuura | |
| 6,526,471 B1 | 2/2003 | Shimomura et al. | |
| 6,526,473 B1 | 2/2003 | Kim | |
| 6,526,484 B1 | 2/2003 | Stacovsky et al. | |
| 6,545,895 B1 | 4/2003 | Li et al. | |
| 6,546,446 B2 | 4/2003 | Farmwald et al. | |
| 6,553,450 B1 | 4/2003 | Dodd et al. | |
| 6,560,158 B2 | 5/2003 | Choi et al. | |
| 6,563,337 B2 | 5/2003 | Dour | |
| 6,563,759 B2 | 5/2003 | Yahata et al. | |
| 6,564,281 B2 | 5/2003 | Farmwald et al. | |
| 6,564,285 B1 | 5/2003 | Mills et al. | 711/103 |
| 6,574,150 B2 | 6/2003 | Suyama et al. | |
| 6,584,037 B2 | 6/2003 | Farmwald et al. | |
| 6,587,912 B2 | 7/2003 | Leddige et al. | |
| 6,590,822 B2 | 7/2003 | Hwang et al. | |
| 6,594,770 B1 | 7/2003 | Sato et al. | |
| 6,597,616 B2 | 7/2003 | Tsern et al. | 365/222 |
| 6,597,617 B2 | 7/2003 | Ooishi et al. | |
| 6,614,700 B2 | 9/2003 | Dietrich et al. | |
| 6,618,267 B1 | 9/2003 | Dalal et al. | |
| 6,618,791 B1 | 9/2003 | Dodd et al. | |
| 6,621,760 B1 | 9/2003 | Ahmad et al. | |
| 6,630,729 B2 | 10/2003 | Huang | |
| 6,631,086 B1 | 10/2003 | Bill et al. | |
| 6,639,820 B1 | 10/2003 | Khandekar et al. | |
| 6,646,939 B2 | 11/2003 | Kwak | |
| 6,650,588 B2 | 11/2003 | Yamagata | 365/222 |
| 6,650,594 B1 | 11/2003 | Lee et al. | |
| 6,657,634 B1 | 12/2003 | Sinclair et al. | |
| 6,657,918 B2 | 12/2003 | Foss et al. | |
| 6,657,919 B2 | 12/2003 | Foss et al. | |
| 6,658,016 B1 * | 12/2003 | Dai et al. | 370/424 |
| 6,658,530 B1 | 12/2003 | Robertson et al. | |
| 6,659,512 B1 | 12/2003 | Harper et al. | |
| 6,664,625 B2 | 12/2003 | Hiruma | |
| 6,665,224 B1 | 12/2003 | Lehmann et al. | |
| 6,665,227 B2 | 12/2003 | Fetzer | |
| 6,668,242 B1 | 12/2003 | Reynov et al. | |
| 6,674,154 B2 | 1/2004 | Minamio et al. | |
| 6,683,372 B1 | 1/2004 | Wong et al. | |
| 6,684,292 B2 * | 1/2004 | Piccirillo et al. | 711/106 |
| 6,697,295 B2 | 2/2004 | Farmwald et al. | |
| 6,701,446 B2 | 3/2004 | Tsern et al. | |
| 6,705,877 B1 | 3/2004 | Li et al. | |
| 6,708,144 B1 | 3/2004 | Merryman et al. | |
| 6,710,430 B2 | 3/2004 | Minamio et al. | |
| 6,711,043 B2 | 3/2004 | Friedman et al. | |
| 6,713,856 B2 | 3/2004 | Tsai et al. | |
| 6,714,891 B2 | 3/2004 | Dendinger | |
| 6,724,684 B2 | 4/2004 | Kim | |
| 6,731,527 B2 | 5/2004 | Brown | 365/63 |
| 6,742,098 B1 | 5/2004 | Halbert et al. | |
| 6,744,687 B2 | 6/2004 | Koo et al. | |
| 6,747,887 B2 | 6/2004 | Halbert et al. | |

| Patent | Kind | Date | Inventor | Class |
|---|---|---|---|---|
| 6,751,113 | B2 | 6/2004 | Bhakta et al. | |
| 6,751,696 | B2 | 6/2004 | Farmwald et al. | |
| 6,754,129 | B2 | 6/2004 | Khatri et al. | |
| 6,754,132 | B2 | 6/2004 | Kyung | |
| 6,757,751 | B1 | 6/2004 | Gene | |
| 6,762,948 | B2 | 7/2004 | Kyun et al. | |
| 6,765,812 | B2 | 7/2004 | Anderson | |
| 6,766,469 | B2 * | 7/2004 | Larson et al. | 714/7 |
| 6,771,526 | B2 | 8/2004 | LaBerge | |
| 6,772,359 | B2 | 8/2004 | Kwak et al. | |
| 6,779,097 | B2 | 8/2004 | Gillingham et al. | |
| 6,785,767 | B2 | 8/2004 | Coulson | |
| 6,791,877 | B2 | 9/2004 | Miura et al. | |
| 6,795,899 | B2 | 9/2004 | Dodd et al. | |
| 6,799,241 | B2 | 9/2004 | Kahn et al. | |
| 6,801,989 | B2 | 10/2004 | Johnson et al. | 711/167 |
| 6,807,598 | B2 | 10/2004 | Farmwald et al. | |
| 6,807,655 | B1 | 10/2004 | Rehani et al. | |
| 6,816,991 | B2 | 11/2004 | Sanghani | |
| 6,819,602 | B2 | 11/2004 | Seo et al. | |
| 6,819,617 | B2 | 11/2004 | Hwang et al. | |
| 6,820,163 | B1 | 11/2004 | McCall et al. | |
| 6,820,169 | B2 | 11/2004 | Wilcox et al. | |
| 6,826,104 | B2 | 11/2004 | Kawaguchi et al. | |
| 6,839,290 | B2 | 1/2005 | Ahmad et al. | |
| 6,845,027 | B2 | 1/2005 | Mayer et al. | |
| 6,845,055 | B1 | 1/2005 | Koga et al. | |
| 6,847,582 | B2 | 1/2005 | Pan | |
| 6,850,449 | B2 | 2/2005 | Takahashi | |
| 6,862,202 | B2 | 3/2005 | Schaefer | |
| 6,862,249 | B2 | 3/2005 | Kyung | |
| 6,862,653 | B1 | 3/2005 | Dodd et al. | |
| 6,873,534 | B2 | 3/2005 | Bhakta et al. | |
| 6,878,570 | B2 | 4/2005 | Lyu et al. | |
| 6,894,933 | B2 | 5/2005 | Kuzmenka et al. | |
| 6,898,683 | B2 | 5/2005 | Nakamura | |
| 6,908,314 | B2 | 6/2005 | Brown | |
| 6,912,778 | B2 | 7/2005 | Ahn et al. | |
| 6,914,786 | B1 | 7/2005 | Paulsen et al. | |
| 6,917,219 | B2 | 7/2005 | New | 326/41 |
| 6,922,371 | B2 | 7/2005 | Takahashi et al. | |
| 6,930,900 | B2 | 8/2005 | Bhakta et al. | |
| 6,930,903 | B2 | 8/2005 | Bhakta et al. | |
| 6,938,119 | B2 | 8/2005 | Kohn et al. | |
| 6,943,450 | B2 | 9/2005 | Fee et al. | |
| 6,944,748 | B2 | 9/2005 | Sanches et al. | |
| 6,947,341 | B2 * | 9/2005 | Stubbs et al. | 365/201 |
| 6,951,982 | B2 | 10/2005 | Chye et al. | |
| 6,952,794 | B2 * | 10/2005 | Lu | 714/7 |
| 6,961,281 | B2 | 11/2005 | Wong et al. | |
| 6,968,416 | B2 | 11/2005 | Moy | |
| 6,968,419 | B1 | 11/2005 | Holman | |
| 6,970,968 | B1 | 11/2005 | Holman | |
| 6,980,021 | B1 | 12/2005 | Srivastava et al. | 326/30 |
| 6,986,118 | B2 | 1/2006 | Dickman | |
| 6,992,501 | B2 | 1/2006 | Rapport | |
| 6,992,950 | B2 | 1/2006 | Foss et al. | |
| 7,000,062 | B2 | 2/2006 | Perego et al. | |
| 7,003,618 | B2 | 2/2006 | Perego et al. | |
| 7,003,639 | B2 | 2/2006 | Tsern et al. | |
| 7,007,095 | B2 * | 2/2006 | Chen et al. | 709/230 |
| 7,007,175 | B2 | 2/2006 | Chang et al. | |
| 7,010,642 | B2 | 3/2006 | Perego et al. | |
| 7,010,736 | B1 | 3/2006 | Teh et al. | |
| 7,024,518 | B2 | 4/2006 | Halbert et al. | 711/115 |
| 7,026,708 | B2 | 4/2006 | Cady et al. | |
| 7,028,215 | B2 * | 4/2006 | Depew et al. | 714/7 |
| 7,028,234 | B2 | 4/2006 | Huckaby et al. | |
| 7,033,861 | B1 | 4/2006 | Partridge et al. | |
| 7,035,150 | B2 | 4/2006 | Streif et al. | |
| 7,043,599 | B1 | 5/2006 | Ware et al. | 711/106 |
| 7,045,396 | B2 | 5/2006 | Crowley et al. | |
| 7,045,901 | B2 | 5/2006 | Lin et al. | |
| 7,046,538 | B2 | 5/2006 | Kinsley et al. | |
| 7,053,470 | B1 | 5/2006 | Sellers et al. | |
| 7,058,776 | B2 | 6/2006 | Lee | 711/167 |
| 7,058,863 | B2 | 6/2006 | Kouchi et al. | |
| 7,061,784 | B2 | 6/2006 | Jakobs et al. | |
| 7,061,823 | B2 | 6/2006 | Faue et al. | |
| 7,066,741 | B2 | 6/2006 | Burns et al. | |
| 7,075,175 | B2 | 7/2006 | Kazi et al. | |
| 7,079,396 | B2 | 7/2006 | Gates et al. | |
| 7,079,441 | B1 | 7/2006 | Partsch et al. | |
| 7,079,446 | B2 | 7/2006 | Murtagh et al. | |
| 7,085,152 | B2 | 8/2006 | Ellis et al. | 365/149 |
| 7,085,941 | B2 | 8/2006 | Li | |
| 7,089,438 | B2 | 8/2006 | Raad | |
| 7,093,101 | B2 | 8/2006 | Aasheim et al. | |
| 7,103,730 | B2 | 9/2006 | Saxena et al. | |
| 7,119,428 | B2 | 10/2006 | Tanie et al. | |
| 7,120,727 | B2 | 10/2006 | Lee et al. | 711/5 |
| 7,126,399 | B1 | 10/2006 | Lee | |
| 7,127,567 | B2 * | 10/2006 | Ramakrishnan et al. | 711/152 |
| 7,133,960 | B1 | 11/2006 | Thompson et al. | 711/5 |
| 7,136,978 | B2 | 11/2006 | Miura et al. | |
| 7,149,145 | B2 | 12/2006 | Kim et al. | 365/233 |
| 7,149,824 | B2 | 12/2006 | Johnson | |
| 7,173,863 | B2 | 2/2007 | Conley et al. | |
| 7,200,021 | B2 | 4/2007 | Raghuram | 365/51 |
| 7,205,789 | B1 | 4/2007 | Karabatsos | |
| 7,210,059 | B2 | 4/2007 | Jeddeloh | |
| 7,215,561 | B2 | 5/2007 | Park et al. | |
| 7,218,566 | B1 | 5/2007 | Totolos, Jr. et al. | |
| 7,224,595 | B2 | 5/2007 | Dreps et al. | 365/63 |
| 7,228,264 | B2 | 6/2007 | Barrenscheen et al. | |
| 7,231,562 | B2 * | 6/2007 | Ohlhoff et al. | 714/718 |
| 7,233,541 | B2 | 6/2007 | Yamamoto et al. | 365/230.03 |
| 7,234,081 | B2 * | 6/2007 | Nguyen et al. | 714/42 |
| 7,243,185 | B2 | 7/2007 | See et al. | |
| 7,245,541 | B2 | 7/2007 | Janzen | |
| 7,254,036 | B2 | 8/2007 | Pauley et al. | 361/721 |
| 7,266,639 | B2 | 9/2007 | Raghuram | 711/115 |
| 7,269,042 | B2 | 9/2007 | Kinsley et al. | 365/52 |
| 7,269,708 | B2 | 9/2007 | Ware | |
| 7,274,583 | B2 | 9/2007 | Park et al. | |
| 7,277,333 | B2 | 10/2007 | Schaefer | |
| 7,286,436 | B2 | 10/2007 | Bhakta et al. | 365/230 |
| 7,289,386 | B2 | 10/2007 | Bhakta et al. | |
| 7,296,754 | B2 | 11/2007 | Nishizawa et al. | 235/492 |
| 7,299,330 | B2 | 11/2007 | Gillingham et al. | |
| 7,302,598 | B2 | 11/2007 | Suzuki et al. | |
| 7,307,863 | B2 | 12/2007 | Yen et al. | 365/63 |
| 7,317,250 | B2 | 1/2008 | Koh et al. | |
| 7,363,422 | B2 | 4/2008 | Perego et al. | 711/105 |
| 7,366,947 | B2 * | 4/2008 | Gower et al. | 714/8 |
| 7,379,316 | B2 | 5/2008 | Rajan | |
| 7,386,656 | B2 | 6/2008 | Rajan et al. | |
| 7,392,338 | B2 | 6/2008 | Rajan et al. | |
| 7,408,393 | B1 | 8/2008 | Jain et al. | 327/202 |
| 7,409,492 | B2 | 8/2008 | Tanaka et al. | 711/103 |
| 7,414,917 | B2 | 8/2008 | Ruckerbauer et al. | |
| 7,428,644 | B2 | 9/2008 | Jeddeloh et al. | |
| 7,437,579 | B2 | 10/2008 | Jeddeloh et al. | 713/300 |
| 7,441,064 | B2 | 10/2008 | Gaskins | |
| 7,457,122 | B2 | 11/2008 | Lai et al. | |
| 7,464,225 | B2 | 12/2008 | Tsern | 711/115 |
| 7,472,220 | B2 | 12/2008 | Rajan et al. | 711/103 |
| 7,474,576 | B2 | 1/2009 | Co et al. | |
| 7,480,147 | B2 | 1/2009 | Hoss et al. | |
| 7,480,774 | B2 * | 1/2009 | Ellis et al. | 711/154 |
| 7,496,777 | B2 | 2/2009 | Kapil | 713/324 |
| 7,515,453 | B2 | 4/2009 | Rajan | 365/63 |
| 7,532,537 | B2 | 5/2009 | Solomon et al. | 365/230 |
| 7,539,800 | B2 * | 5/2009 | Dell et al. | 710/100 |
| 7,573,136 | B2 | 8/2009 | Jiang et al. | |
| 7,580,312 | B2 | 8/2009 | Rajan et al. | |
| 7,581,121 | B2 | 8/2009 | Barth et al. | |
| 7,581,127 | B2 | 8/2009 | Rajan et al. | |
| 7,590,796 | B2 | 9/2009 | Rajan et al. | |
| 7,599,205 | B2 | 10/2009 | Rajan | |
| 7,606,245 | B2 * | 10/2009 | Ma et al. | 370/401 |
| 7,609,567 | B2 | 10/2009 | Rajan et al. | |
| 7,613,880 | B2 | 11/2009 | Miura et al. | |
| 7,619,912 | B2 | 11/2009 | Bhakta et al. | |
| 7,724,589 | B2 | 5/2010 | Rajan et al. | |
| 7,730,338 | B2 | 6/2010 | Rajan et al. | |
| 7,761,724 | B2 | 7/2010 | Rajan et al. | |
| 2001/0000822 | A1 | 5/2001 | Dell et al. | |

| | | |
|---|---|---|
| 2001/0003198 A1 | 6/2001 | Wu |
| 2001/0011322 A1 | 8/2001 | Stolt et al. |
| 2001/0021106 A1 | 9/2001 | Weber et al. |
| 2001/0021137 A1 | 9/2001 | Kai et al. |
| 2001/0046129 A1 | 11/2001 | Broglia et al. |
| 2001/0046163 A1 | 11/2001 | Yanagawa |
| 2002/0002662 A1 | 1/2002 | Olarig et al. |
| 2002/0004897 A1* | 1/2002 | Kao et al. ................. 712/227 |
| 2002/0015340 A1 | 2/2002 | Batinovich |
| 2002/0019961 A1 | 2/2002 | Blodgett |
| 2002/0034068 A1 | 3/2002 | Weber et al. |
| 2002/0038405 A1 | 3/2002 | Leddige et al. |
| 2002/0041507 A1 | 4/2002 | Woo et al. |
| 2002/0051398 A1 | 5/2002 | Mizugaki ................. 365/222 |
| 2002/0060945 A1 | 5/2002 | Ikeda |
| 2002/0064073 A1 | 5/2002 | Chien |
| 2002/0064083 A1 | 5/2002 | Ryu et al. |
| 2002/0089831 A1 | 7/2002 | Forthun |
| 2002/0089970 A1* | 7/2002 | Asada et al. ................. 370/351 |
| 2002/0094671 A1 | 7/2002 | Distefano et al. |
| 2002/0121650 A1 | 9/2002 | Minamio et al. |
| 2002/0121670 A1 | 9/2002 | Minamio et al. |
| 2002/0124195 A1 | 9/2002 | Nizar |
| 2002/0129204 A1 | 9/2002 | Leighnor et al. |
| 2002/0145900 A1 | 10/2002 | Schaefer |
| 2002/0165706 A1 | 11/2002 | Raynham ................. 703/25 |
| 2002/0167092 A1 | 11/2002 | Fee et al. |
| 2002/0172024 A1 | 11/2002 | Hui et al. |
| 2002/0174274 A1 | 11/2002 | Wu et al. |
| 2002/0184438 A1 | 12/2002 | Usui |
| 2003/0002262 A1 | 1/2003 | Benisek et al. |
| 2003/0011993 A1 | 1/2003 | Summers et al. |
| 2003/0016550 A1 | 1/2003 | Yoo et al. |
| 2003/0021175 A1 | 1/2003 | Tae Kwak |
| 2003/0026155 A1 | 2/2003 | Yamagata |
| 2003/0026159 A1 | 2/2003 | Frankowsky et al. |
| 2003/0035312 A1 | 2/2003 | Halbert et al. |
| 2003/0039158 A1 | 2/2003 | Horiguchi et al. |
| 2003/0041295 A1* | 2/2003 | Hou et al. ................. 714/710 |
| 2003/0061458 A1 | 3/2003 | Wilcox et al. |
| 2003/0061459 A1 | 3/2003 | Aboulenein et al. |
| 2003/0093614 A1 | 5/2003 | Kohn et al. |
| 2003/0101392 A1 | 5/2003 | Lee |
| 2003/0105932 A1 | 6/2003 | David et al. |
| 2003/0117875 A1 | 6/2003 | Lee et al. |
| 2003/0123389 A1* | 7/2003 | Russell et al. ................. 370/230 |
| 2003/0126338 A1 | 7/2003 | Dodd et al. |
| 2003/0127737 A1 | 7/2003 | Takahashi |
| 2003/0131160 A1 | 7/2003 | Hampel et al. |
| 2003/0145163 A1 | 7/2003 | Seo et al. ................. 711/106 |
| 2003/0158995 A1 | 8/2003 | Lee et al. |
| 2003/0164539 A1 | 9/2003 | Yau |
| 2003/0164543 A1 | 9/2003 | Kheng Lee |
| 2003/0182513 A1 | 9/2003 | Dodd et al. |
| 2003/0183934 A1 | 10/2003 | Barrett |
| 2003/0189868 A1 | 10/2003 | Riesenman et al. |
| 2003/0189870 A1 | 10/2003 | Wilcox |
| 2003/0191888 A1 | 10/2003 | Klein |
| 2003/0191915 A1 | 10/2003 | Saxena et al. |
| 2003/0200382 A1 | 10/2003 | Wells et al. |
| 2003/0200474 A1 | 10/2003 | Li |
| 2003/0205802 A1 | 11/2003 | Segaram et al. |
| 2003/0206476 A1 | 11/2003 | Joo |
| 2003/0217303 A1 | 11/2003 | Chua-Eoan et al. |
| 2003/0223290 A1 | 12/2003 | Park et al. ................. 365/200 |
| 2003/0227798 A1 | 12/2003 | Pax |
| 2003/0229821 A1 | 12/2003 | Ma |
| 2003/0230801 A1 | 12/2003 | Jiang et al. |
| 2003/0231540 A1 | 12/2003 | Lazar et al. |
| 2003/0231542 A1 | 12/2003 | Zaharinova-Papazova et al. |
| 2003/0234664 A1 | 12/2003 | Yamagata |
| 2004/0016994 A1 | 1/2004 | Huang |
| 2004/0027902 A1 | 2/2004 | Ooishi et al. |
| 2004/0034732 A1 | 2/2004 | Valin et al. |
| 2004/0034755 A1 | 2/2004 | LaBerge et al. |
| 2004/0037133 A1 | 2/2004 | Park et al. ................. 365/202 |
| 2004/0044808 A1 | 3/2004 | Salmon et al. |
| 2004/0047228 A1 | 3/2004 | Chen |
| 2004/0057317 A1 | 3/2004 | Schaefer |
| 2004/0064647 A1 | 4/2004 | DeWhitt et al. |
| 2004/0064767 A1 | 4/2004 | Huckaby et al. |
| 2004/0083324 A1 | 4/2004 | Rabinovitz et al. |
| 2004/0088475 A1 | 5/2004 | Streif et al. |
| 2004/0100837 A1 | 5/2004 | Lee |
| 2004/0117723 A1 | 6/2004 | Foss |
| 2004/0123173 A1 | 6/2004 | Emberling et al. ................. 714/733 |
| 2004/0125635 A1 | 7/2004 | Kuzmenka |
| 2004/0133736 A1 | 7/2004 | Kyung |
| 2004/0139359 A1 | 7/2004 | Samson et al. |
| 2004/0145963 A1 | 7/2004 | Byon |
| 2004/0151038 A1 | 8/2004 | Ruckerbauer et al. |
| 2004/0174765 A1 | 9/2004 | Seo et al. |
| 2004/0177079 A1 | 9/2004 | Gluhovsky et al. ................. 707/100 |
| 2004/0178824 A1 | 9/2004 | Pan |
| 2004/0184324 A1 | 9/2004 | Pax |
| 2004/0186956 A1 | 9/2004 | Perego et al. |
| 2004/0188704 A1 | 9/2004 | Halbert et al. |
| 2004/0196732 A1 | 10/2004 | Lee |
| 2004/0205433 A1* | 10/2004 | Gower et al. ................. 714/733 |
| 2004/0208173 A1 | 10/2004 | Di Gregorio ................. 370/360 |
| 2004/0225858 A1 | 11/2004 | Brueggen |
| 2004/0228166 A1 | 11/2004 | Braun et al. |
| 2004/0228196 A1 | 11/2004 | Kwak et al. |
| 2004/0228203 A1 | 11/2004 | Koo |
| 2004/0230932 A1 | 11/2004 | Dickmann |
| 2004/0236877 A1 | 11/2004 | Burton |
| 2004/0250989 A1 | 12/2004 | Im et al. |
| 2004/0256638 A1 | 12/2004 | Perego et al. |
| 2004/0257847 A1 | 12/2004 | Matsui et al. |
| 2004/0260957 A1 | 12/2004 | Jeddeloh et al. |
| 2004/0264255 A1 | 12/2004 | Royer |
| 2004/0268161 A1 | 12/2004 | Ross |
| 2005/0018495 A1 | 1/2005 | Bhakta et al. |
| 2005/0021874 A1 | 1/2005 | Georgiou et al. |
| 2005/0024963 A1 | 2/2005 | Jakobs et al. |
| 2005/0027928 A1 | 2/2005 | Avraham et al. ................. 711/103 |
| 2005/0028038 A1 | 2/2005 | Pomaranski et al. |
| 2005/0034004 A1 | 2/2005 | Bunker et al. |
| 2005/0036350 A1 | 2/2005 | So et al. |
| 2005/0041504 A1 | 2/2005 | Perego et al. |
| 2005/0044303 A1 | 2/2005 | Perego et al. |
| 2005/0044305 A1 | 2/2005 | Jakobs et al. |
| 2005/0047192 A1 | 3/2005 | Matsui et al. |
| 2005/0071543 A1 | 3/2005 | Ellis et al. |
| 2005/0078532 A1 | 4/2005 | Ruckerbauer et al. |
| 2005/0081085 A1 | 4/2005 | Ellis et al. |
| 2005/0099834 A1 | 5/2005 | Funaba et al. |
| 2005/0102590 A1 | 5/2005 | Norris et al. |
| 2005/0105318 A1 | 5/2005 | Funaba et al. |
| 2005/0108460 A1 | 5/2005 | David |
| 2005/0127531 A1 | 6/2005 | Tay et al. |
| 2005/0132158 A1 | 6/2005 | Hampel et al. ................. 711/167 |
| 2005/0135176 A1* | 6/2005 | Ramakrishnan et al. 365/230.01 |
| 2005/0138267 A1 | 6/2005 | Bains et al. |
| 2005/0138304 A1* | 6/2005 | Ramakrishnan et al. ...... 711/158 |
| 2005/0139977 A1 | 6/2005 | Nishio et al. |
| 2005/0141199 A1 | 6/2005 | Chiou et al. |
| 2005/0149662 A1 | 7/2005 | Perego |
| 2005/0152212 A1 | 7/2005 | Yang et al. |
| 2005/0156934 A1 | 7/2005 | Perego et al. |
| 2005/0166026 A1 | 7/2005 | Ware et al. |
| 2005/0193163 A1 | 9/2005 | Perego |
| 2005/0194676 A1 | 9/2005 | Fukuda et al. |
| 2005/0194991 A1 | 9/2005 | Dour et al. |
| 2005/0195629 A1 | 9/2005 | Leddige et al. |
| 2005/0201063 A1 | 9/2005 | Lee et al. |
| 2005/0204111 A1 | 9/2005 | Natarajan |
| 2005/0207255 A1 | 9/2005 | Perego et al. |
| 2005/0210196 A1 | 9/2005 | Perego et al. |
| 2005/0223179 A1 | 10/2005 | Perego et al. |
| 2005/0224948 A1 | 10/2005 | Lee et al. |
| 2005/0232049 A1* | 10/2005 | Park ................. 365/222 |
| 2005/0235119 A1 | 10/2005 | Sechrest et al. |
| 2005/0235131 A1 | 10/2005 | Ware |
| 2005/0237838 A1 | 10/2005 | Kwak et al. ................. 365/222 |
| 2005/0243635 A1 | 11/2005 | Schaefer ................. 365/227 |
| 2005/0249011 A1 | 11/2005 | Maeda |
| 2005/0259504 A1 | 11/2005 | Murtugh et al. |

| | | |
|---|---|---|
| 2005/0263312 A1 | 12/2005 | Bolken et al. |
| 2005/0265506 A1 | 12/2005 | Foss et al. |
| 2005/0269715 A1 | 12/2005 | Yoo |
| 2005/0278474 A1 | 12/2005 | Perersen et al. |
| 2005/0281096 A1 | 12/2005 | Bhakta et al. |
| 2005/0281123 A1 | 12/2005 | Bell et al. |
| 2005/0283572 A1 | 12/2005 | Ishihara |
| 2005/0285174 A1 | 12/2005 | Saito et al. |
| 2005/0289292 A1 | 12/2005 | Morrow et al. |
| 2005/0289317 A1 | 12/2005 | Liou et al. ............... 711/170 |
| 2006/0002201 A1 | 1/2006 | Janzen ..................... 365/191 |
| 2006/0010339 A1 | 1/2006 | Klein |
| 2006/0026484 A1 | 2/2006 | Hollums ................... 714/746 |
| 2006/0038597 A1 | 2/2006 | Becker et al. |
| 2006/0039204 A1 | 2/2006 | Cornelius |
| 2006/0039205 A1 | 2/2006 | Cornelius |
| 2006/0041711 A1 | 2/2006 | Miura et al. |
| 2006/0041730 A1 | 2/2006 | Larson |
| 2006/0044909 A1 | 3/2006 | Kinsley et al. ............ 365/222 |
| 2006/0044913 A1 | 3/2006 | Klein et al. |
| 2006/0049502 A1 | 3/2006 | Goodwin et al. |
| 2006/0050574 A1 | 3/2006 | Streif et al. |
| 2006/0056244 A1 | 3/2006 | Ware ......................... 365/194 |
| 2006/0062047 A1 | 3/2006 | Bhakta et al. |
| 2006/0067141 A1 | 3/2006 | Perego et al. |
| 2006/0085616 A1 | 4/2006 | Zeighami et al. |
| 2006/0087900 A1 | 4/2006 | Bucksch et al. |
| 2006/0090031 A1 | 4/2006 | Kirshenbaum et al. |
| 2006/0090054 A1 | 4/2006 | Choi et al. |
| 2006/0106951 A1 | 5/2006 | Bains ........................... 710/5 |
| 2006/0112214 A1 | 5/2006 | Yeh |
| 2006/0112219 A1* | 5/2006 | Chawla et al. ............ 711/114 |
| 2006/0117152 A1 | 6/2006 | Amidi et al. .............. 711/154 |
| 2006/0117160 A1 | 6/2006 | Jackson et al. |
| 2006/0118933 A1 | 6/2006 | Haba |
| 2006/0120193 A1 | 6/2006 | Casper |
| 2006/0123265 A1 | 6/2006 | Ruckerbauer et al. |
| 2006/0126369 A1 | 6/2006 | Raghuram |
| 2006/0129712 A1 | 6/2006 | Raghuram |
| 2006/0129740 A1 | 6/2006 | Ruckerbauer et al. |
| 2006/0129755 A1 | 6/2006 | Raghuram |
| 2006/0133173 A1 | 6/2006 | Jain et al. |
| 2006/0136791 A1 | 6/2006 | Nierle |
| 2006/0149982 A1 | 7/2006 | Vogt |
| 2006/0174082 A1 | 8/2006 | Bellows et al. |
| 2006/0176744 A1 | 8/2006 | Stave |
| 2006/0179333 A1 | 8/2006 | Brittain et al. |
| 2006/0179334 A1 | 8/2006 | Brittain et al. |
| 2006/0180926 A1 | 8/2006 | Mullen et al. |
| 2006/0181953 A1 | 8/2006 | Rotenberg et al. |
| 2006/0195631 A1 | 8/2006 | Rajamani |
| 2006/0198178 A1 | 9/2006 | Kinsley et al. |
| 2006/0203590 A1 | 9/2006 | Mori et al. |
| 2006/0206738 A1 | 9/2006 | Jeddeloh et al. |
| 2006/0233012 A1 | 10/2006 | Sekiguchi et al. |
| 2006/0236165 A1* | 10/2006 | Cepulis et al. ............ 714/721 |
| 2006/0236201 A1* | 10/2006 | Gower et al. ............. 714/758 |
| 2006/0248261 A1 | 11/2006 | Jacob et al. |
| 2006/0248387 A1 | 11/2006 | Nicholson et al. |
| 2006/0262586 A1 | 11/2006 | Solomon et al. |
| 2006/0294295 A1 | 12/2006 | Fukuzo |
| 2007/0005998 A1 | 1/2007 | Jain et al. |
| 2007/0050530 A1 | 3/2007 | Rajan .............................. 711/5 |
| 2007/0058471 A1 | 3/2007 | Rajan et al. ............... 365/222 |
| 2007/0070669 A1 | 3/2007 | Tsern |
| 2007/0088995 A1 | 4/2007 | Tsern et al. |
| 2007/0091696 A1 | 4/2007 | Niggemeier et al. |
| 2007/0106860 A1 | 5/2007 | Foster et al. .............. 711/170 |
| 2007/0136537 A1 | 6/2007 | Doblar et al. |
| 2007/0162700 A1 | 7/2007 | Fortin et al. |
| 2007/0188997 A1 | 8/2007 | Hockanson et al. |
| 2007/0192563 A1 | 8/2007 | Rajan et al. ............... 711/202 |
| 2007/0195613 A1 | 8/2007 | Rajan et al. ............ 365/189.05 |
| 2007/0204075 A1 | 8/2007 | Rajan et al. |
| 2007/0216445 A1 | 9/2007 | Raghavan et al. ........... 326/83 |
| 2007/0247194 A1 | 10/2007 | Jain ............................... 326/87 |
| 2007/0279084 A1 | 12/2007 | Oh et al. |
| 2007/0288683 A1 | 12/2007 | Panabaker et al. |
| 2007/0288686 A1 | 12/2007 | Arcedera et al. .......... 711/103 |
| 2007/0288687 A1 | 12/2007 | Panabaker |
| 2008/0002447 A1 | 1/2008 | Gulachenski et al. |
| 2008/0010435 A1 | 1/2008 | Smith et al. |
| 2008/0025108 A1 | 1/2008 | Rajan et al. ............ 365/189.05 |
| 2008/0025122 A1 | 1/2008 | Schakel et al. ............ 365/222 |
| 2008/0025136 A1 | 1/2008 | Rajan et al. ............ 365/230.08 |
| 2008/0025137 A1 | 1/2008 | Rajan et al. ............... 365/239 |
| 2008/0027697 A1 | 1/2008 | Rajan et al. ................... 703/14 |
| 2008/0027702 A1 | 1/2008 | Rajan et al. ................... 703/21 |
| 2008/0027703 A1 | 1/2008 | Rajan et al. ................... 703/21 |
| 2008/0028135 A1 | 1/2008 | Rajan et al. |
| 2008/0028136 A1 | 1/2008 | Schakel et al. ............ 711/106 |
| 2008/0028137 A1 | 1/2008 | Schakel et al. |
| 2008/0031030 A1 | 2/2008 | Rajan et al. ................. 365/63 |
| 2008/0031072 A1 | 2/2008 | Rajan et al. ................ 365/227 |
| 2008/0037353 A1 | 2/2008 | Rajan et al. ................ 365/227 |
| 2008/0056014 A1 | 3/2008 | Rajan et al. ............ 365/189.03 |
| 2008/0062773 A1 | 3/2008 | Rajan et al. ............ 365/189.03 |
| 2008/0065820 A1 | 3/2008 | Gillingham et al. |
| 2008/0082763 A1 | 4/2008 | Rajan et al. ................ 711/154 |
| 2008/0086588 A1 | 4/2008 | Danilak et al. |
| 2008/0089034 A1 | 4/2008 | Hoss et al. |
| 2008/0098277 A1* | 4/2008 | Hazelzet ..................... 714/753 |
| 2008/0103753 A1 | 5/2008 | Rajan et al. |
| 2008/0104314 A1 | 5/2008 | Rajan et al. |
| 2008/0109206 A1 | 5/2008 | Rajan et al. |
| 2008/0109595 A1 | 5/2008 | Rajan et al. |
| 2008/0109597 A1 | 5/2008 | Schakel et al. |
| 2008/0109598 A1 | 5/2008 | Schakel et al. |
| 2008/0115006 A1 | 5/2008 | Smith et al. ................ 713/601 |
| 2008/0120443 A1 | 5/2008 | Rajan et al. |
| 2008/0120458 A1 | 5/2008 | Gillingham et al. |
| 2008/0123459 A1 | 5/2008 | Rajan et al. ................ 365/227 |
| 2008/0126687 A1 | 5/2008 | Rajan et al. |
| 2008/0126688 A1 | 5/2008 | Rajan et al. |
| 2008/0126689 A1 | 5/2008 | Rajan et al. |
| 2008/0126690 A1 | 5/2008 | Rajan et al. ................ 711/105 |
| 2008/0126692 A1 | 5/2008 | Rajan et al. |
| 2008/0133825 A1 | 6/2008 | Rajan et al. |
| 2008/0159027 A1 | 7/2008 | Kim |
| 2008/0170425 A1 | 7/2008 | Rajan |
| 2008/0195894 A1 | 8/2008 | Schreck et al. |
| 2008/0239857 A1 | 10/2008 | Rajan et al. ................ 365/227 |
| 2008/0239858 A1 | 10/2008 | Rajan et al. ................ 365/227 |
| 2009/0024789 A1 | 1/2009 | Rajan et al. |
| 2009/0024790 A1 | 1/2009 | Rajan et al. |
| 2009/0109613 A1 | 4/2009 | Legen et al. |
| 2009/0216939 A1 | 8/2009 | Smith et al. |
| 2009/0285031 A1 | 11/2009 | Rajan et al. |
| 2009/0290442 A1 | 11/2009 | Rajan |
| 2010/0005218 A1 | 1/2010 | Gower et al. |
| 2010/0020585 A1 | 1/2010 | Rajan |
| 2010/0257304 A1 | 10/2010 | Rajan et al. |
| 2010/0271888 A1 | 10/2010 | Rajan et al. |
| 2010/0281280 A1 | 11/2010 | Rajan et al. |

FOREIGN PATENT DOCUMENTS

| | | |
|---|---|---|
| DE | 102004053316 | 5/2006 |
| DE | 102005036528 | 2/2007 |
| EP | 0644547 | 3/1995 |
| JP | 62121978 | 6/1987 |
| JP | 01171047 | 7/1989 |
| JP | 03-29357 | 2/1991 |
| JP | 03-276487 B2 | 12/1991 |
| JP | 03286234 | 12/1991 |
| JP | 07-141870 | 6/1995 |
| JP | 08-77097 | 3/1996 |
| JP | 11-149775 | 6/1999 |
| JP | 2002052255 | 1/2002 |
| JP | 3304893 B2 | 5/2002 |
| JP | 2006236388 | 9/2006 |
| KR | 1020040062717 | 7/2004 |
| WO | WO95/05676 | 2/1995 |
| WO | WO9900734 | 1/1999 |
| WO | WO01/90900 | 11/2001 |
| WO | WO01/97160 | 12/2001 |
| WO | WO2007002324 | 1/2007 |
| WO | WO2007/028109 | 3/2007 |

| | | |
|---|---|---|
| WO | WO2007/038225 | 4/2007 |
| WO | WO2007/095080 | 8/2007 |
| WO | WO2008063251 | 5/2008 |

OTHER PUBLICATIONS

Final Office Action from U.S. Appl. No. 11/461,435 mailed on Jan. 28, 2009.
Non-final Office Action from U.S. Appl. No. 11/461,437 mailed on Jan. 26, 2009.
Non-final Office Action from U.S. Appl. No. 11/939,432 mailed on Feb. 19, 2009.
German Office Action From German Patent Application No. 11 2006 002 300.4-55 Mailed Jun. 5, 2009 (With Translation).
Non-Final Office Action From U.S. Appl. No. 11/461,430 Mailed Feb. 19, 2009.
Final Office Action From U.S. Appl. No. 11/461,435 Mailed Jan. 28, 2009.
Non-Final Office Action From U.S. Appl. No. 11/461,437 Mailed Jan. 26, 2009.
Non-Final Office Action From U.S. Appl. No. 11/461,441 Mailed Apr. 2, 2009.
Non-Final Office Action From U.S. Appl. No. 11/611,374 Mailed Mar. 23, 2009.
Non-Final Office Action From U.S. Appl. No. 11/762,010 Mailed Mar. 20, 2009.
Non-Final Office Action From U.S. Appl. No. 11/939,432 Mailed Feb. 6, 2009.
Non-Final Office Action From U.S. Appl. No. 12/111,819 Mailed Apr. 27, 2009.
Non-Final Office Action From U.S. Appl. No. 12/111,828 Mailed Apr. 17, 2009.
Office Action from U.S. Appl. No. 11/461,427 mailed on Sep. 5, 2008.
Final Office Action from U.S. Appl. No. 11/461,430 mailed on Sep. 8, 2008.
Notice of Allowance from U.S. Appl. No. 11/474,075 mailed on Nov. 26, 2008.
Office Action from U.S. Appl. No. 11/474,076 mailed on Nov. 3, 2008.
Office Action from U.S. Appl. No. 11/524,811 mailed on Sep. 17, 2008.
Fang et al., W. Power Complexity Analysis Of Adiabatic SRAM, 6th Int. Conference On ASIC, vol. 1, Oct. 2005, pp. 334-337.
Pavan et al., P. A Complete Model Of E2PROM Memory Cells For Circuit Simulations, IEEE Transactions On Computer-Aided Design Of Integrated Circuits And Systems, vol. 22, No. 8, Aug. 2003, pp. 1072-1079.
German Office Action From German Patent Application No. 11 2006 001 810.8-55 Mailed Apr. 20, 2009 (With Translation).
Final Rejection From U.S. Appl. No. 11/461,437 Mailed Nov. 10, 2009.
Final Rejection from U.S. Appl. No. 11/762,010 Mailed Dec. 4, 2009.
Non-Final Rejection from U.S. Appl. No. 11/672,921 Mailed Dec. 8, 2009.
Non-Final Rejection from U.S. Appl. No. 11/672,924 Mailed Dec. 14, 2009.
Non-Final Rejection from U.S. Appl. No. 11/929,225 Mailed Dec. 14, 2009.
Non-Final Rejection from U.S. Appl. No. 11/929,261 Mailed Dec. 14, 2009.
Notice of Allowance From U.S. Appl. No. 11/611,374 Mailed Nov. 30, 2009.
Notice of Allowance From U.S. Appl. No. 11/939,432 Mailed Dec. 1, 2009.
Notice of Allowance From U.S. Appl. No. 12/111,819 Mailed Nov. 20, 2009.
Notice of Allowance From U.S. Appl. No. 12/111,828 Mailed Dec. 15, 2009.
Examination Report from GB Intellectual Property Office from GB Patent Appin. No. GB0803913.3 Dated Mar. 1, 2010.
Office Action from U.S. Appl. No. 11/461,435 Dated May 13, 2010.
Final Office Action from U.S. Appl. No. 11/515,167 Dated Jun. 3, 2010.
Notice of Allowance from U.S. Appl. No. 11/515,223 Dated Jul. 30, 2010.
Final Office Action from U.S. Appl. No. 11/553,390 Dated Jun. 24, 2010.
Notice of Allowance from U.S. Appl. No. 11/611,374 Dated Jul. 19, 2010.
Final Office Action from U.S. Appl. No. 11/672,921 Dated Jul. 23, 2010.
Final Office Action from U.S. Appl. No. 11/702,960 Dated Jun. 21, 2010.
Notice of Allowance from U.S. Appl. No. 11/762,010 Dated Jul. 2, 2010.
Final Office Action from U.S. Appl. No. 11/929,500 Dated Jun. 24, 2010.
Office Action from U.S. Appl. No. 12/574,628 Dated Jun. 10, 2010.
Great Britain Office Action from GB Patent Application No. GB0800734.6 Mailed Mar. 1, 2010.
Final Office Action from U.S. Appl. No. 11/461,420 Mailed Apr. 28, 2010.
Notice of Allowance from U.S. Appl. No. 11/553,372 Mailed Mar. 12, 2010.
Notice of Allowance from U.S. Appl. No. 11/553,399 Mailed Mar. 22, 2010.
Non-Final Office Action from U.S. Appl. No. 11/588,739 Mailed Dec. 29, 2009.
Notice of Allowance from U.S. Appl. No. 11/611,374 Mailed Apr. 5, 2010.
Non-Final Office Action from U.S. Appl. No. 11/828,181 Mailed Mar. 2, 2010.
Non-Final Office Action from U.S. Appl. No. 11/828,182 Mailed Mar. 29, 2010.
Final Office Action from U.S. Appl. No. 11/858,518 Mailed Apr. 21, 2010.
Non-Final Office Action from U.S. Appl. No. 11/929,432 Mailed Jan. 14, 2010.
Non-Final Office Action from U.S. Appl. No. 11/929,571 Mailed Mar. 3, 2010.
Non-Final Office Action from U.S. Appl. No. 11/929,631 Mailed Mar. 3, 2010.
Non-Final Office Action from U.S. Appl. No. 11/929,636 Mailed Mar. 9, 2010.
Non-Final Office Action from U.S. Appl. No. 11/929,655 Mailed Mar. 3, 2010.
Non-Final Office Action from U.S. Appl. No. 11/939,432 Mailed Apr. 12, 2010.
Notice of Allowance from U.S. Appl. No. 12/111,819 Mailed Mar. 10, 2010.
Non-Final Office Action from U.S. Appl. No. 12/507,682 Mailed Mar. 8, 2010.
Non-Final Office Action from U.S. Appl. No. 11/461,420 Dated Jul. 23, 2009.
Notice of Allowance from U.S. Appl. No. 11/461,430 Dated Sep. 10, 2009.
Non-Final Office Action from U.S. Appl. No. 11/461,435 Dated Aug. 5, 2009.
Non-Final Office Action from U.S. Appl. No. 11/515,167 Dated Sep. 25, 2009.
Non-Final Office Action from U.S. Appl. No. 11/515,223 Dated Sep. 22, 2009.
Non-Final Office Action from U.S. Appl. No. 11/538,041 Dated Jun. 10, 2009.
Non-Final Office Action from U.S. Appl. No. 11/553,372 Dated Jun. 25, 2009.
Notice of Allowance from U.S. Appl. No. 11/553,372 Dated Sep. 30, 2009.
Non-Final Office Action from U.S. Appl. No. 11/553,390 Dated Sep. 9, 2009.
Non-Final Office Action from U.S. Appl. No. 11/553,399 Dated Jul. 7, 2009.
Notice of Allowance from U.S. Appl. No. 11/553,399 Dated Oct. 13, 2009.

Notice of Allowance from U.S. Appl. No. 11/611,374 Dated Sep. 15, 2009.
Non-Final Office Action from U.S. Appl. No. 11/702,960 Dated Sep. 25, 2009.
Non-Final Office Action from U.S. Appl. No. 11/702,981 Dated Aug. 19, 2009.
Non-Final Office Action from U.S. Appl. No. 11/762,013 Dated Jun. 5, 2009.
Non-Final Office Action from U.S. Appl. No. 11/858,518 Dated Aug. 14, 2009.
Non-Final Office Action from U.S. Appl. No. 11/929,500 Dated Oct. 13, 2009.
Notice of Allowance from U.S. Appl. No. 11/939,432 Dated Sep. 24, 2009.
Non-Final Office Action from U.S. Appl. No. 11/941,589 Dated Oct. 1, 2009.
BIOS and Kernel Developer's Guide (BKDG) Family 10h Processor, Sep. 7, 2007, Published for Processor Family Purchasers.
Skerlj et al. "Buffer Device for Memory Modules". 2006, p. 1.
Kellerbauer, R. "Die Schnelle Million," with translation, "The Quick Million: Memory Expansion for 1040 ST and Mega ST 1," Dec. 1991.
Supplemental European Search Report And Search Opinion issued Sep. 21, 2009 in European Application No. 07870726.2, 8 pp.
Wu et al., "eNVy: A Non-Volatile, Main Memory Storage System", ASPLOS-VI Proceedings, Oct. 4-7, 1994, pp. 86-97.
Using Two Chip Selects To Enable Quad Rank, From IP.COM # 000132468D, Feb. 26, 2008.
Buffer Device for Memory Modules (DIMM), IP.com Prior Art Database, <URL: http://ip.com/IPCOM/000144850>, Feb. 10, 2007, 1 pg.
German Office Action from German Patent Application No. 11 2006 002 300.4-55 Dated May 11, 2009 (With Translation).
Great Britain Office Action from GB Patent Application No. GB0803913.3 Dated Mar. 1, 2010.
Preliminary Report on Patentability From PCT Application No. PCT/US06/24360 Dated on Jan. 10, 2008.
Written Opinion From PCT Application No. PCT/US06/24360 Dated on Jan. 8, 2007.
International Search Report From PCT Application No. PCT/US06/34390 Dated on Nov. 21, 2007.
Written Opinion From PCT Application No. PCT/US06/34390 Dated on Nov. 21, 2007.
International Preliminary Examination Report From PCT Application No. PCT/US07/016385 Dated Feb. 3, 2009.
Search Report and Written Opinion From PCT Application No. PCT/US07/03460 Dated on Feb. 14, 2008.
Notice of Allowance from U.S. Appl. No. 11/553,372 Dated Aug. 4, 2010.
Notice of Allowance from U.S. Appl. No. 11/553,399 Dated Dec. 3, 2010.
Notice of Allowance from U.S. Appl. No. 11/611,374 Dated Oct. 29, 2010.
Final Office Action from U.S. Appl. No. 11/672,924 Dated Sep. 7, 2010.
Non-Final Office Action from U.S. Appl. No. 11/702,981 Dated Mar. 11, 2009.
Notice of Allowance from U.S. Appl. No. 11/762,010 Dated Oct. 22, 2010.
Notice of Allowance from U.S. Appl. No. 11/762,013 Dated Aug. 17, 2010.
Notice of Allowance from U.S. Appl. No. 11/762,013 Dated Dec. 7, 2010.
Non-Final Office Action from U.S. Appl. No. 11/855,805 Dated Sep. 21, 2010.
Non-Final Office Action from U.S. Appl. No. 11/858,518 Dated Sep. 8, 2010.
Final Office Action from U.S. Appl. No. 11/929,225 Dated Aug. 27, 2010.
Final Office Action from U.S. Appl. No. 11/929,261 Dated Sep. 7, 2010.
Final Office Action from U.S. Appl. No. 11/929,286 Dated Aug. 20, 2010.
Notice of Allowance from U.S. Appl. No. 11/929,320 Dated Sep. 29, 2010.
Final Office Action from U.S. Appl. No. 11/929,403 Dated Aug. 31, 2010.
Final Office Action from U.S. Appl. No. 11/929,417 Dated Aug. 31, 2010.
Final Office Action from U.S. Appl. No. 11/929,432 Dated Aug. 20, 2010.
Final Office Action from U.S. Appl. No. 11/929,450 Dated Aug. 20, 2010.
Notice of Allowance from U.S. Appl. No. 11/929,483 Dated Oct. 7, 2010.
Final Office Action from U.S. Appl. No. 11/929,631 Dated Nov. 18, 2010.
Final Office Action from U.S. Appl. No. 11/929,655 Dated Nov. 22, 2010.
Non-Final Office Action from U.S. Appl. No. 11/939,440 Dated Sep. 17, 2010.
Notice of Allowance from U.S. Appl. No. 11/941,589 Dated Oct. 25, 2010.
Non-Final Office Action from U.S. Appl. No. 12/057,306 Dated Oct. 8, 2010.
Non-Final Office Action from U.S. Appl. No. 12/203,100 Dated Dec. 1, 2010.
Non-Final Office Action from U.S. Appl. No. 12/769,428 Dated Nov. 8, 2010.
Non-Final Office Action from U.S. Appl. No. 12/838,896 Dated Sep. 3, 2010.
Search Report From PCT Application No. PCT/US10/038041 Dated Aug. 23, 2010.
Non-Final Office Action from U.S. Appl. No. 11/461,437 dated Jan. 4, 2011.
Notice Of Allowance from U.S. Appl. No. 11/515,223 Dated Feb. 4, 2011.
Non-Final Office Action from U.S. Appl. No. 11/553,372 Dated Jan. 5, 2011.
Final Office Action from U.S. Appl. No. 11/588,739 Dated Dec. 15, 2010.
Notice Of Allowance from U.S. Appl. No. 11/762,010 Dated Feb. 18, 2011.
Final Office Action from U.S. Appl. No. 11/828,182 Dated Dec. 22, 2010.
Non-Final Office Action from U.S. Appl. No. 11/855,826 Dated Jan. 13, 2011.
Notice Of Allowance from U.S. Appl. No. 11/939,432 Dated Feb. 18, 2011.
Notice Of Allowance from U.S. Appl. No. 12/144,396 Dated Feb. 1, 2011.
Non-Final Office Action from U.S. Appl. No. 12/816,756 Dated Feb. 7, 2011.
Notice Of Allowance from U.S. Appl. No. 11/762,013 Dated Feb. 23, 2011.
Notice Of Allowance from U.S. Appl. No. 11/929,500 Dated Feb. 24, 2011.
Notice Of Allowance from U.S. Appl. No. 11/763,365 Dated Mar. 1, 2011.
Final Office Action from U.S. Appl. No. 12/574,628 Dated Mar. 3, 2011.
Final Office Action from U.S. Appl. No. 11/929,571 Dated Mar. 3, 2011.
Notice of Allowance from U.S. Appl. No. 11/611,374 Dated Mar. 4, 2011.
Notice of Allowance from U.S. Appl. No. 11/929,483 Dated Mar. 4, 2011.
Notice of Allowance from U.S. Appl. No. 11/553,399 Dated Mar. 18, 2011.
Final Office Action from U.S. Appl. No. 12/507,682 Dated Mar. 29, 2011.
Non-Final Office Action from U.S. Appl. No. 11/929,403 Dated Mar. 31, 2011.
Notice of Allowance from U.S. Appl. No. 12/838,896 Dated Apr. 19, 2011.

Notice of Allowance from U.S. Appl. No. 11/702,981 Dated Apr. 25, 2011.
Notice of Allowance from U.S. Appl. No. 11/929,320 Dated May 5, 2011.
Final Office Action from U.S. Appl. No. 11/939,440 Dated May 19, 2011.

Final Office Action from U.S. Appl. No. 11/855,805, Dated May 26, 2011.
Non-Final Office Action from U.S. Appl. No. 11/672,921 Dated May 27, 2011.

* cited by examiner

MEMORY SYSTEMS AND MEMORY MODULES

CROSS-REFERENCE TO RELATED APPLICATIONS

The current application is a continuation-in-part of U.S. patent application Ser. No. 11/474,076, filed on Jun. 23, 2006, which claims priority to U.S. Provisional Patent Application No. 60/693,631, filed on Jun. 24, 2005. The current application is a continuation-in-part of U.S. patent application Ser. No. 11/515,223, filed on Sep. 1, 2006, which claims priority to U.S. Provisional Patent Application No. 60/713,815, filed on Sep. 2, 2005. The current application also claims the priority benefit of U.S. Provisional Patent Application No. 60/814,234, filed on Jun. 16, 2006 and titled, "Memory Systems and Memory Modules." The subject matter of the above-listed related applications is hereby incorporated herein by reference.

BACKGROUND OF THE INVENTION

1. Field of Invention

This application relates generally to memory systems and more specifically to memory modules that include reliability and serviceability features and functionalities.

2. Description of the Related Art

Memory systems in computers are typically built from memory modules. An example of a common type of memory module is a Dual Inline Memory Module or DIMM. It is very important for many computers, particularly in classes of computers known as servers, that the memory system be as reliable as possible. It is also very important that the computer and memory system are built in such a way that the computer can be serviced as quickly, easily and as inexpensively as possible. Together these important features are often known as Reliability and Serviceability (RAS) features.

SUMMARY OF THE INVENTION

Computers are often required to have a very low probability of failure. In order to reduce the probability of failure it is often required to add reliability features to the memory system and to the memory modules in a computer memory system.

The embodiments described herein are a series of RAS features that may be used in memory systems. One embodiment of the present invention sets forth a memory module that includes at least one memory chip, and an intelligent chip coupled to the at least one memory chip and a memory controller, where the intelligent chip is configured to implement at least a part of a RAS feature.

DETAILED DESCRIPTION

In order to build cost-effective memory modules it can be advantageous to build register and buffer chips that do have the ability to perform logical operations on data, dynamic storage of information, manipulation of data, sensing and reporting or other intelligent functions. Such chips are referred to in this specification as intelligent register chips and intelligent buffer chips. The generic term, "intelligent chip," is used herein to refer to either of these chips. Intelligent register chips in this specification are generally connected between the memory controller and the intelligent buffer chips. The intelligent buffer chips in this specification are generally connected between the intelligent register chips and one or more memory chips. One or more RAS features may be implemented locally to the memory module using one or more intelligent register chips, one or more intelligent buffer chips, or some combination thereof.

Figure 1A:
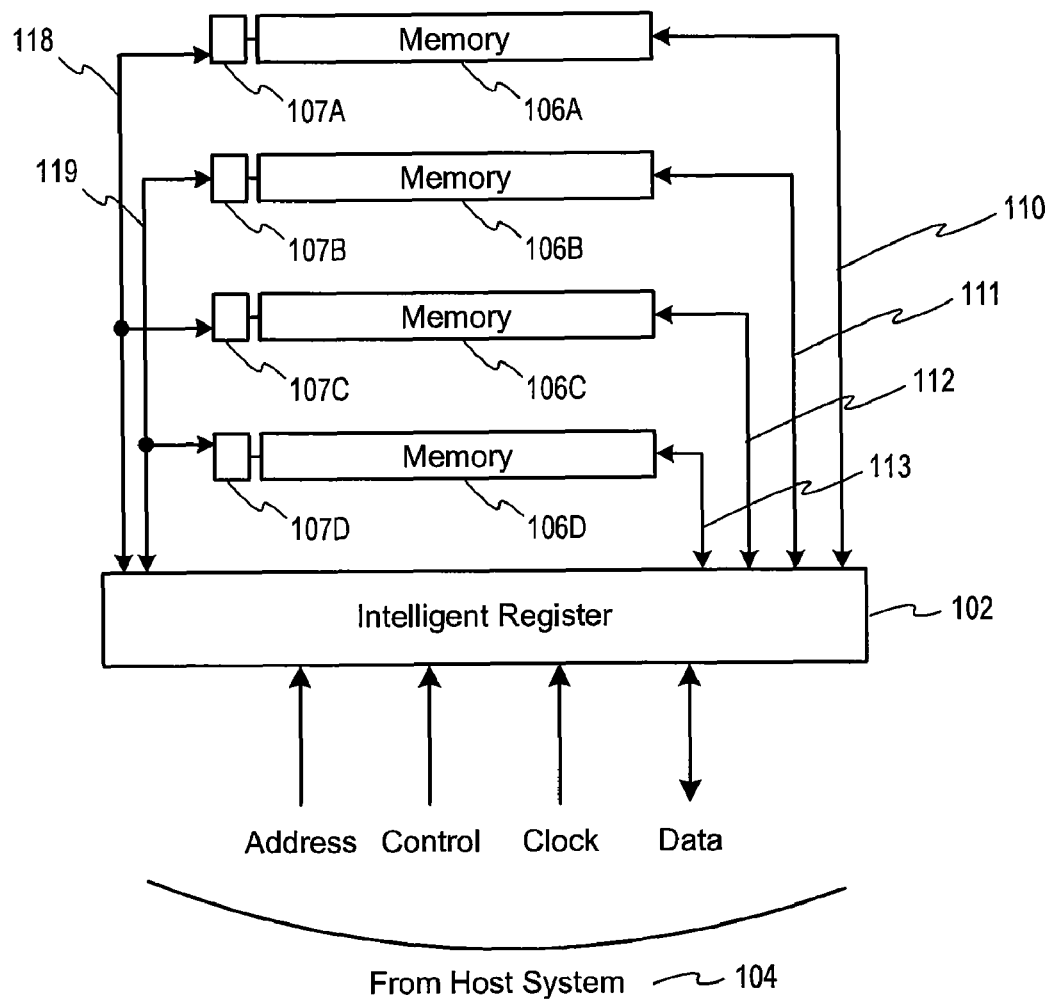
FIG. 1A depicts connectivity in an embodiment that includes an intelligent register and multiple buffer chips.

In the arrangement shown in FIG. 1A, one or more intelligent register chips 102 are in direct communication with the host system 104 via the address, control, clock and data signals to/from the host system. One or more intelligent buffer chips 107A-107D are disposed between the intelligent register chips and the memory chips 106A-106D. The signals 110, 111, 112, 113, 118 and 119 between an intelligent register chip and one or more intelligent buffer chips may be shared by the one or more intelligent buffer chips. In the embodiment depicted, the signals from the plural intelligent register chips to the intelligent buffer chips and, by connectivity, to the plural memory chips, may be independently controllable by separate instances of intelligent register chips. In another arrangement the intelligent buffer chips are connected to a stack of memory chips.

The intelligent buffer chips may buffer data signals and/or address signals, and/or control signals. The buffer chips 107A-107D may be separate chips or integrated into a single chip. The intelligent register chip may or may not buffer the data signals as is shown in FIG. 1A.

The embodiments described here are a series of RAS features that may be used in memory systems. The embodiments are particularly applicable to memory systems and memory modules that use intelligent register and buffer chips.

Indication of Failed Memory

Figure 1B:
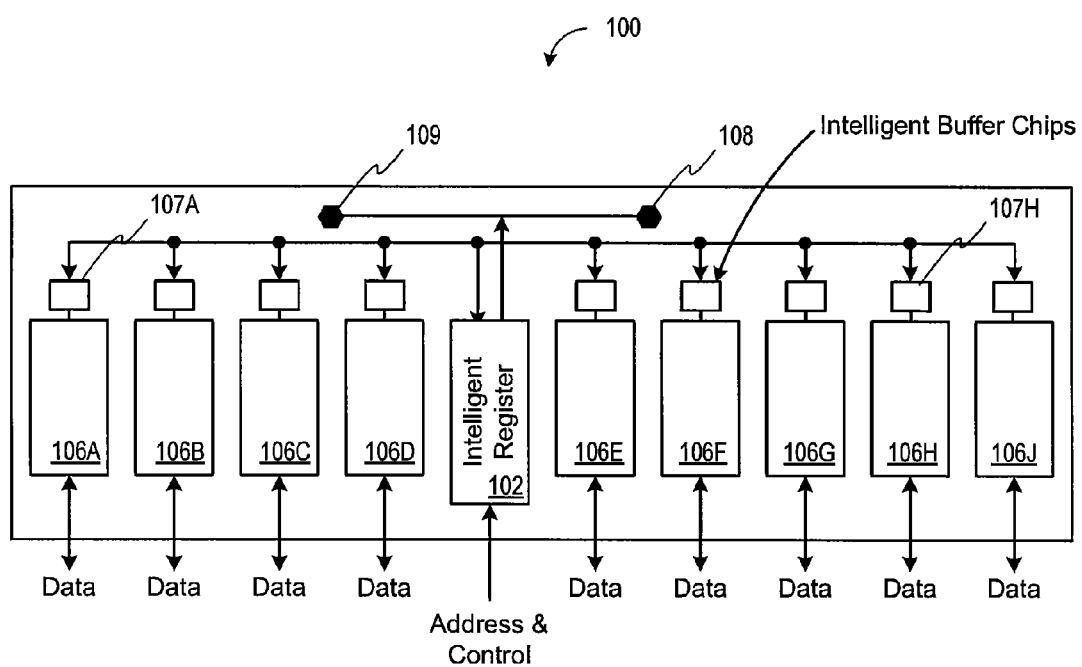
FIG. 1B depicts a generalized layout of components on a DIMM, including LEDs.

As shown in FIG. 1B, light-emitting diodes (LEDs) 108, 109 can be mounted on a memory module 100. The CPU or host or memory controller, or an intelligent register can recognize or determine if a memory chip 106A-106J on a memory module has failed and illuminate one or more of the LEDs 108, 109. If the memory module contains one or more intelligent buffer chips 107A, 107H or intelligent register chips 102, these chips may be used to control the LEDs directly. As an alternative to the LEDs and in combination with the intelligent buffer and/or register chips, the standard non-volatile memory that is normally included on memory modules to record memory parameters may be used to store information on whether the memory module has failed.

In FIG. 1B, the data signals are not buffered (by an intelligent register chip or by an intelligent buffer chip). Although the intelligent buffer chips 107A-107H are shown in FIG. 1B as connected directly to the intelligent register chip and act to buffer signals from the intelligent register chip, the same or other intelligent buffer chips may also be connected to buffer the data signals.

Currently indication of a failed memory module is done indirectly if it is done at all. One method is to display information on the failed memory module on a computer screen. Often only the failing logical memory location is shown on a screen, perhaps just the logical address of the failing memory cell in a DRAM, which means it is very difficult for the computer operator or repair technician to quickly and easily determine which physical memory module to replace. Often the computer screen is also remote from the physical location of the memory module and this also means it is difficult for an operator to quickly and easily find the memory module that has failed. Another current method uses a complicated and expensive combination of buttons, panels, switches and LEDs on the motherboard to indicate that a component on or attached to the motherboard has failed. None of these methods place the LED directly on the failing memory module allowing the operator to easily and quickly identify the memory module to be replaced. This embodiment adds just one low-cost part to the memory module.

This embodiment is part of the memory module and thus can be used in any computer. The memory module can be moved between computers of different types and manufacturer.

Further, the intelligent register chip 102 and/or buffer chip 107A-107J on a memory module can self-test the memory and indicate failure by illuminating an LED. Such a self-test may use writing and reading of a simple pattern or more complicated patterns such as, for example, "walking-1's" or "checkerboard" patterns that are known to exercise the memory more thoroughly. Thus the failure of a memory module can be indicated via the memory module LED even if the operating system or control mechanism of the computer is incapable of working.

Further, the intelligent buffer chip and/or register chip on a memory module can self-test the memory and indicate correct operation via illumination of a second LED 109. Thus a failed memory module can be easily identified using the first LED 108 that indicates failure and switched by the operator with a replacement. The first LED might be red for example to indicate failure. The memory module then performs a self-test and illuminates the second LED 109. The second LED might be green for example to indicate successful self-test. In this manner the operator or service technician can not only quickly and easily identify a failing memory module, even if the operating system is not working, but can effect a replacement and check the replacement, all without the intervention of an operating system.

Memory Sparing

One memory reliability feature is known as memory sparing.

Under one definition, the failure of a memory module occurs when the number of correctable errors caused by a memory module reaches a fixed or programmable threshold. If a memory module or part of a memory module fails in such a manner in a memory system that supports memory sparing, another memory module can be assigned to take the place of the failed memory module.

In the normal mode of operation, the computer reads and writes data to active memory modules. In some cases, the computer may also contain spare memory modules that are not active. In the normal mode of operation the computer does not read or write data to the spare memory module or modules, and generally the spare memory module or modules do not store data before memory sparing begins. The memory sparing function moves data from the memory module that is showing errors to the spare memory modules if the correctable error count exceeds the threshold value. After moving the data, the system inactivates the failed memory module and may report or record the event.

In a memory module that includes intelligent register and/or intelligent buffer chips, powerful memory sparing capabilities may be implemented.

Figure 2A:
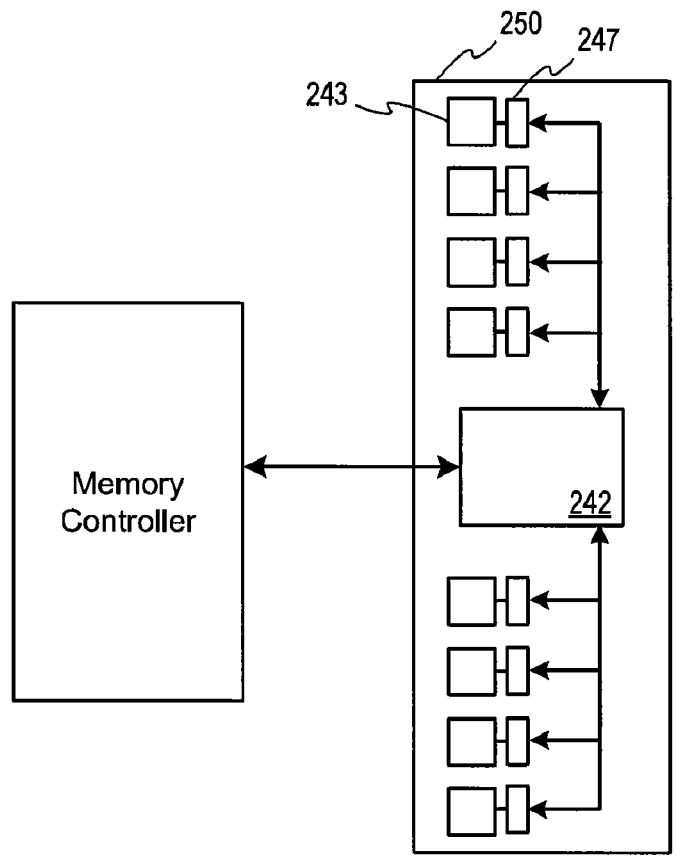
FIG. 2A depicts a memory subsystem with a memory controller in communication with multiple DIMMs.

For example, and as illustrated in FIG. 2A the intelligent register chip 242 that is connected indirectly or directly to all DRAM chips 243 on a memory module 250 may monitor temperature of the DIMM, the buffer chips and DRAM, the frequency of use of the DRAM and other parameters that may affect failure. The intelligent register chip can also gather data about all DRAM chip failures on the memory module and can make intelligent decisions about sparing memory within the memory module instead of having to spare an entire memory module.

Figure 2B:
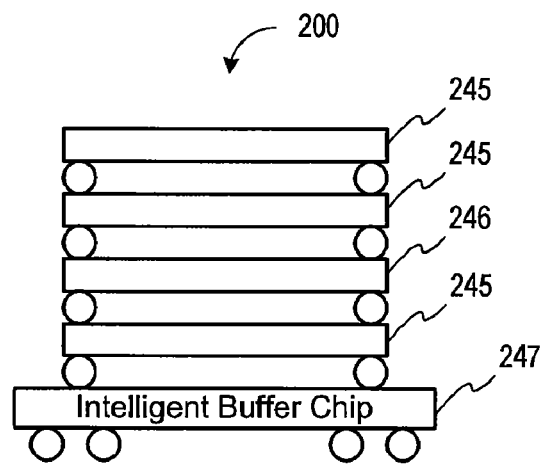
FIG. 2B depicts a side view of a stack of memory including an intelligent buffer chip.

Further, as shown in FIG. 2A and FIG. 2B, an intelligent buffer chip 247 that may be connected to one or more DRAMs 245 in a stack 200 is able to monitor each DRAM 245 in the stack and if necessary spare a DRAM 246 in the stack. In the exemplary embodiment, the spared DRAM 246 is shown as an inner component of the stack. In other possible embodiments the spared DRAM may be any one of the components of the stack including either or both of the top and bottom DRAMs.

Although the intelligent buffer chips 247 are shown in FIG. 2B as connected directly to the intelligent register chip 242 and to buffer signals from the intelligent register chip, the same or other intelligent buffer chips may also be connected to buffer the data signals. Thus, by including intelligent register and buffer chips in a memory module, it is possible to build memory modules that can implement memory sparing at the level of being able to use a spare individual memory, a spare stack of memory, or a spare memory module.

Figure 3:
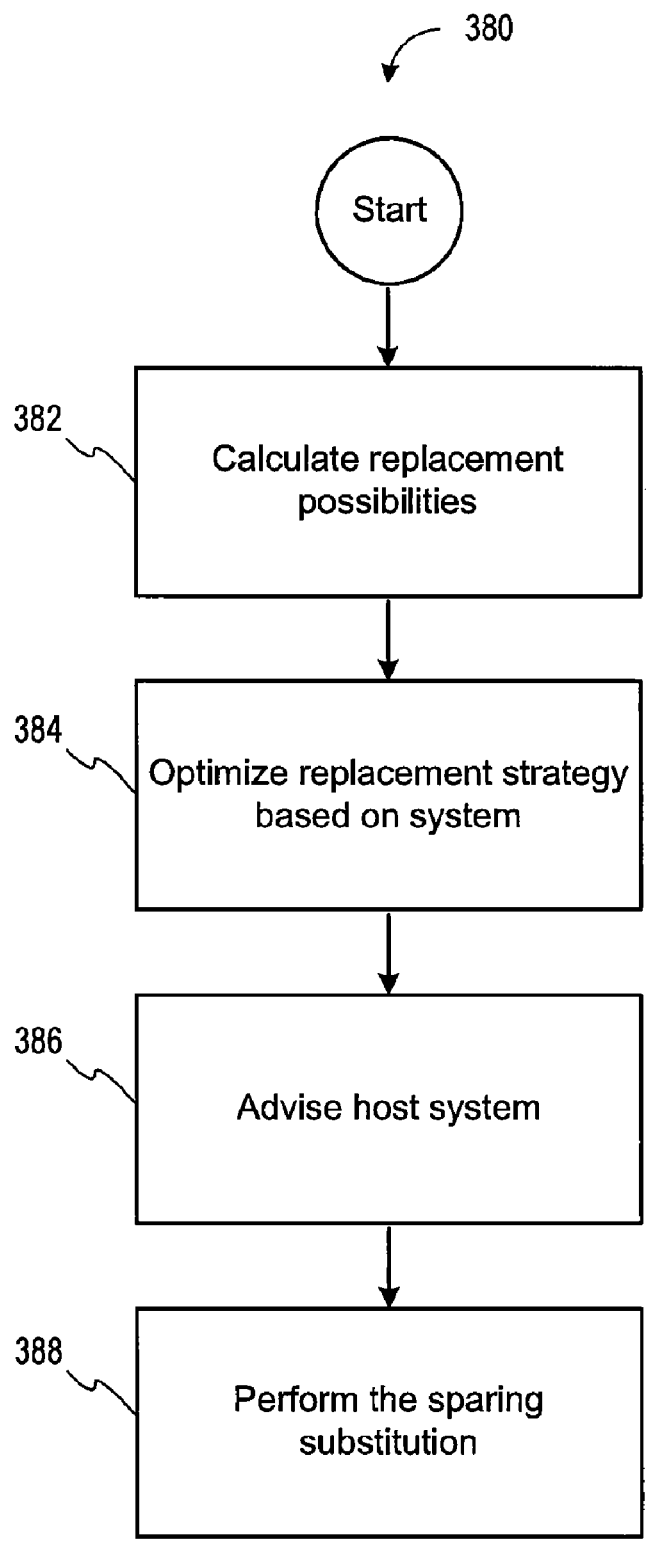
FIG. 3 depicts steps for performing a sparing substitution.

In some embodiments, and as shown in FIG. 3, a sparing method 380 may be implemented in conjunction with a sparing strategy. In such a case, the intelligent buffer chip may calculate replacement possibilities 382, optimize the replacement based on the system 384 or a given strategy and known characteristics of the system, advise the host system of the sparing operation to be performed 386, and perform the sparing substitution or replacement 388.

Memory Mirroring

Another memory reliability feature is known as memory mirroring.

In normal operation of a memory mirroring mode, the computer writes data to two memory modules at the same time: a primary memory module (the mirrored memory module) and the mirror memory module.

If the computer detects an uncorrectable error in a memory module, the computer will re-read data from the mirror memory module. If the computer still detects an uncorrectable error, the computer system may attempt other means of recovery beyond the scope of simple memory mirroring. If the computer does not detect an error, or detects a correctable error, from the mirror module, the computer will accept that data as the correct data. The system may then report or record this event and proceed in a number of ways (including returning to check the original failure, for example).

In a memory module that includes intelligent register and/or intelligent buffer chips, powerful memory mirroring capabilities may be implemented.

Figure 4:
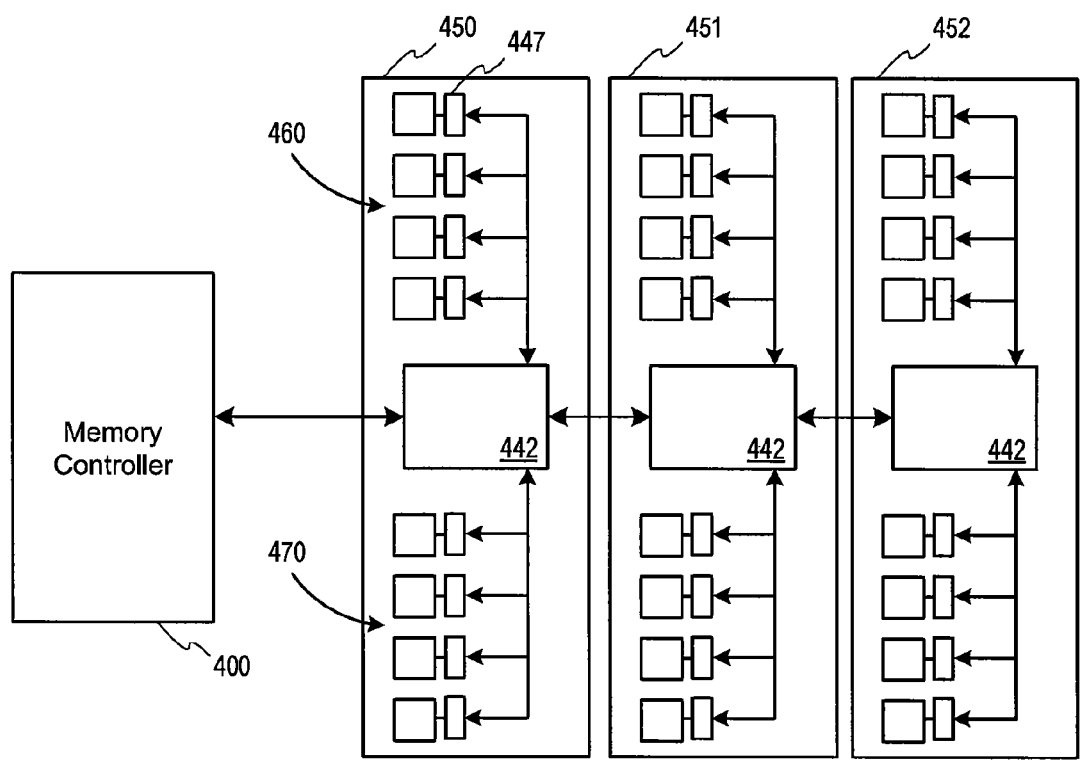
FIG. 4 depicts a memory subsystem where a portion of the memory on a DIMM is spared.

For example, as shown in FIG. 4, the intelligent register chip 442 allows a memory module to perform the function of both mirrored and mirror modules by dividing the DRAM on the module into two sections 460 and 470. The intelligent buffer chips may allow DRAM stacks to perform both mirror and mirrored functions. In the embodiment shown in FIG. 4, the computer or the memory controller 400 on the computer motherboard may still be in control of performing the mirror functions by reading and writing data to as if there were two memory modules.

In another embodiment, a memory module with intelligent register chips 442 and/or intelligent buffer chips 447 that can perform mirroring functions may be made to look like a normal memory module to the memory controller. Thus, in the embodiment of FIG. 4, the computer is unaware that the module is itself performing memory mirroring. In this case, the computer may perform memory sparing. In this manner both memory sparing and memory mirroring may be performed on a computer that is normally not capable of providing mirroring and sparing at the same time.

Other combinations are possible. For example a memory module with intelligent buffer and/or control chips can be made to perform sparing with or without the knowledge and/or support of the computer. Thus the computer may, for example, perform mirroring operations while the memory module simultaneously provides sparing function.

Although the intelligent buffer chips 447 are shown in FIG. 4 as connected directly to the intelligent register chip 442 and to buffer signals from the intelligent register chip, the same or other intelligent buffer chips may also be connected to buffer the data signals.

Memory RAID

Another memory reliability feature is known as memory RAID.

To improve the reliability of a computer disk system it is usual to provide a degree of redundancy using spare disks or parts of disks in a disk system known as Redundant Array of Inexpensive Disks (RAID). There are different levels of RAID that are well-known and correspond to different ways of using redundant disks or parts of disks. In many cases, redundant data, often parity data, is written to portions of a disk to allow data recovery in case of failure. Memory RAID improves the reliability of a memory system in the same way that disk RAID improves the reliability of a disk system. Memory mirroring is equivalent to memory RAID level 1, which is equivalent to disk RAID level 1.

In a memory module that includes intelligent register and/or intelligent buffer chips, powerful memory RAID capabilities may be implemented.

For example, as shown in FIG. 4, the intelligent register chip 442 on a memory module allows portions of the memory module to be allocated for RAID operations. The intelligent register chip may also include the computation necessary to read and write the redundant RAID data to a DRAM or DRAM stack allocated for that purpose. Often the parity data is calculated using a simple exclusive-OR (XOR) function that may simply be inserted into the logic of an intelligent register or buffer chip without compromising performance of the memory module or memory system.

In some embodiments, portions 460 and 470 of the total memory on a memory module 450 are allocated for RAID operations. In other embodiments, the portion of the total memory on the memory module that is allocated for RAID operations may be a memory device on a DIMM 243 or a memory device in a stack 245.

In some embodiments, physically separate memory modules 451, and 452 of the total memory in a memory subsystem are allocated for RAID operations.

Memory Defect Re-Mapping

One of the most common failure mechanisms for a memory system is for a DRAM on a memory module to fail. The most common DRAM failure mechanism is for one or more individual memory cells in a DRAM to fail or degrade. A typical mechanism for this type of failure is for a defect to be introduced during the semiconductor manufacturing process. Such a defect may not prevent the memory cell from working but renders it subject to premature failure or marginal operation. Such memory cells are often called weak memory cells. Typically this type of failure may be limited to only a few memory cells in array of a million (in a 1 Mb DRAM) or more memory cells on a single DRAM. Currently the only way to prevent or protect against this failure mechanism is to stop using an entire memory module, which may consist of dozens of DRAM chips and contain a billion (in a 1 Gb DIMM) or more individual memory cells. Obviously the current state of the art is wasteful and inefficient in protecting against memory module failure.

In a memory module that uses intelligent buffer or intelligent register chips, it is possible to locate and/or store the locations of weak memory cells. A weak memory cell will often manifest its presence by consistently producing read errors. Such read errors can be detected by the memory controller, for example using a well-known Error Correction Code (ECC).

In computers that have sophisticated memory controllers, certain types of read errors can be detected and some of them can be corrected. In detecting such an error the memory controller may be designed to notify the DIMM of both the fact that a failure has occurred and/or the location of the weak memory cell. One method to perform this notification, for example, would be for the memory controller to write information to the non-volatile memory or SPD on a memory module. This information can then be passed to the intelligent register and/or buffer chips on the memory module for further analysis and action. For example, the intelligent register chip can decode the weak cell location information and pass the correct weak cell information to the correct intelligent buffer chip attached to a DRAM stack.

Alternatively the intelligent buffer and/or register chips on the memory module can test the DRAM and detect weak cells in an autonomous fashion. The location of the weak cells can then be stored in the intelligent buffer chip connected to the DRAM.

Using any of the methods that provide information on weak cell location, it is possible to check to see if the desired address is a weak memory cell by using the address location provided to the intelligent buffer and/or register chips. The logical implementation of this type of look-up function using a tabular method is well-known and the table used is often called a Table Lookaside Buffer (TLB), Translation Lookaside Buffer or just Lookaside Buffer. If the address is found to correspond to a weak memory cell location, the address can be re-mapped using a TLB to a different known good memory cell. In this fashion the TLB has been used to map-out or re-map the weak memory cell in a DRAM. In practice it may be more effective or efficient to map out a row or column of memory cells in a DRAM, or in general a region of memory cells that include the weak cell. In another embodiment, memory cells in the intelligent chip can be distributed for the weak cells in the DRAM.

Figure 5:
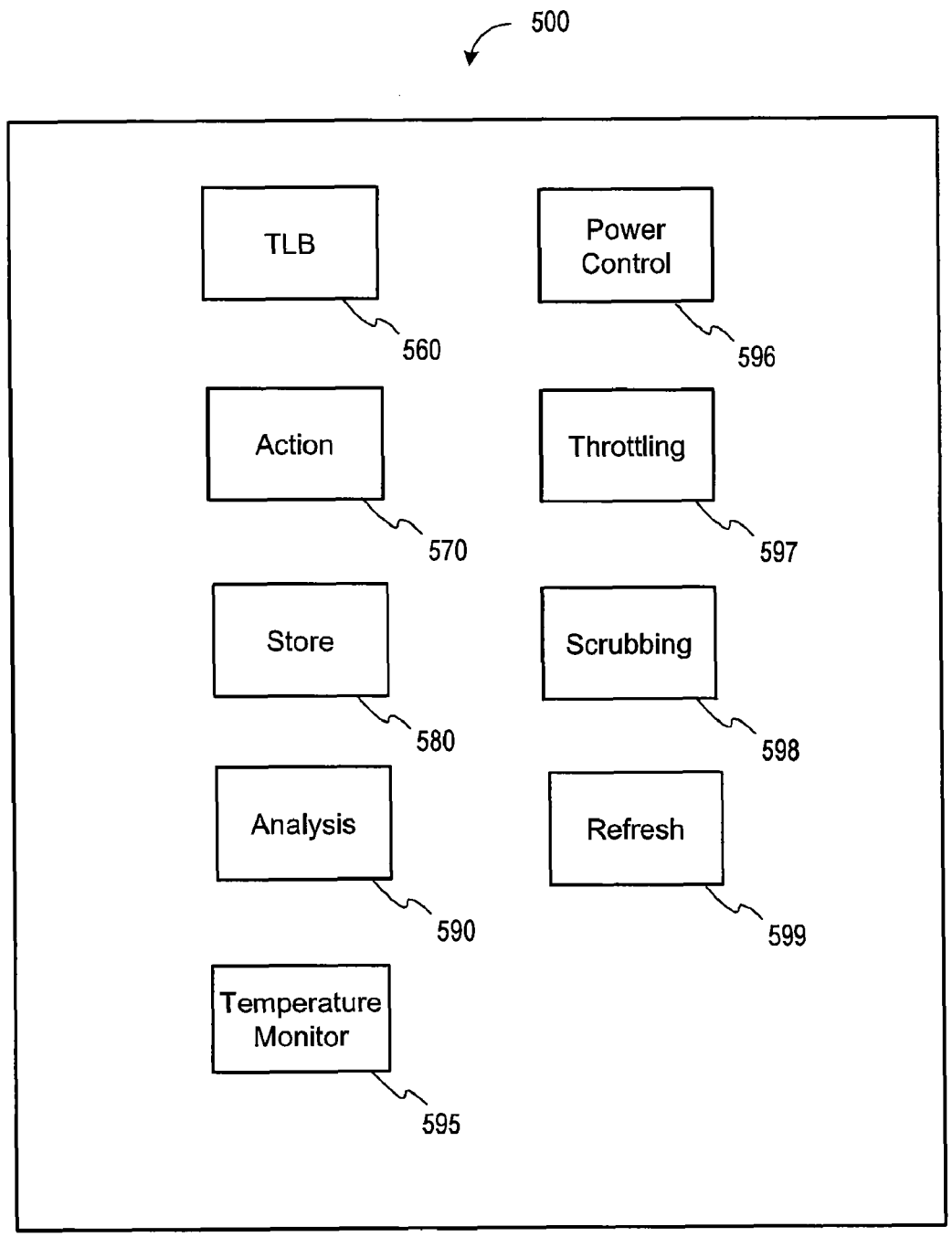
FIG. 5 depicts a selection of functions optionally implemented in an intelligent register chip or an intelligent buffer chip.

FIG. 5 shows an embodiment of an intelligent buffer chip or intelligent register chip which contains a TLB 560 and a store 580 for a mapping from weak cells to known good memory cells.

Memory Status and Information Reporting

There are many mechanisms that computers can use to increase their own reliability if they are aware of status and can gather information about the operation and performance of their constituent components. As an example, many computer disk drives have Self Monitoring Analysis and Reporting Technology (SMART) capability. This SMART capability gathers information about the disk drive and reports it back to the computer. The information gathered often indicates to the computer when a failure is about to occur, for example by monitoring the number of errors that occur when reading a particular area of the disk.

In a memory module that includes intelligent register and/or intelligent buffer chips, powerful self-monitoring and reporting capabilities may be implemented.

Information such as errors, number and location of weak memory cells, and results from analysis of the nature of the errors can be stored in a store 580 and can be analyzed by an analysis function 590 and/or reported to the computer. In various embodiments, the store 580 and the analysis function 590 can be in the intelligent buffer and/or register chips. Such information can be used either by the intelligent buffer and/or register chips, by an action function 570 included in the intelligent buffer chip, or by the computer itself to take action such as to modify the memory system configuration (e.g. sparing) or alert the operator or to use any other mechanism that improves the reliability or serviceability of a computer once it is known that a part of the memory system is failing or likely to fail.

Memory Temperature Monitoring and Thermal Control

Current memory system trends are towards increased physical density and increased power dissipation per unit volume. Such density and power increases place a stress on the thermal design of computers. Memory systems can cause a computer to become too hot to operate reliably. If the computer becomes too hot, parts of the computer may be regulated or performance throttled to reduce power dissipation.

In some cases a computer may be designed with the ability to monitor the temperature of the processor or CPU and in some cases the temperature of a chip on-board a DIMM. In one example, a Fully-Buffered DIMM or FB-DIMM, may contain a chip called an Advanced Memory Buffer or AMB that has the capability to report the AMB temperature to the memory controller. Based on the temperature of the AMB the computer may decide to throttle the memory system to regulate temperature. The computer attempts to regulate the temperature of the memory system by reducing memory activity or reducing the number of memory reads and/or writes performed per unit time. Of course by measuring the temperature of just one chip, the AMB, on a memory module the computer is regulating the temperature of the AMB not the memory module or DRAM itself.

In a memory module that includes intelligent register and/or intelligent buffer chips, more powerful temperature monitoring and thermal control capabilities may be implemented.

For example if a temperature monitoring device 595 is included into an intelligent buffer or intelligent register chip, measured temperature can be reported. This temperature information provides the intelligent register chips and/or the intelligent buffer chips and the computer much more detailed and accurate thermal information than is possible in absence of such a temperature monitoring capability. With more detailed and accurate thermal information, the computer is able to make better decisions about how to regulate power or throttle performance, and this translates to better and improved overall memory system performance for a fixed power budget.

Figure 6A:
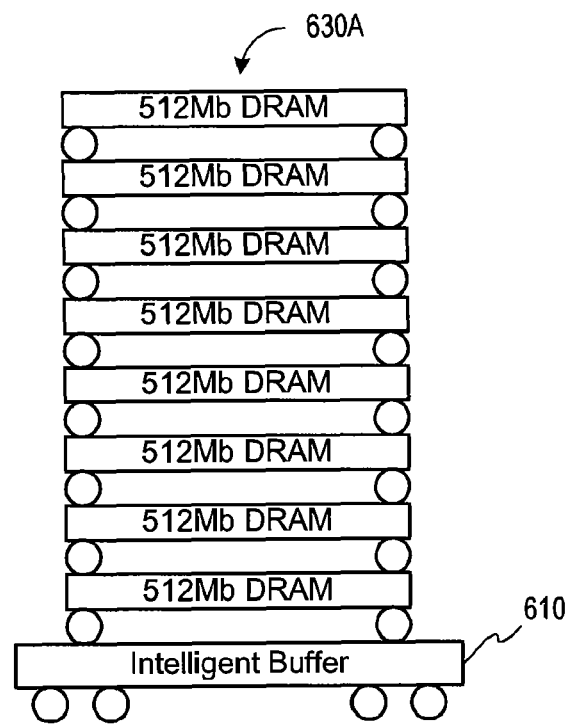
FIG. 6A depicts a memory stack in one embodiment with eight memory chips and one intelligent buffer.

As in the example of FIG. 6A, the intelligent buffer chip 610 may be placed at the bottom of a stack of DRAM chips 630A. By placing the intelligent buffer chip in close physical proximity and also close thermal proximity to the DRAM chip or chips, the temperature of the intelligent buffer chip will accurately reflect the temperature of the DRAM chip or chips. It is the temperature of the DRAM that is the most important temperature data that the computer needs to make better decisions about how to throttle memory performance. Thus, the use of a temperature sensor in an intelligent buffer chip greatly improves the memory system performance for a fixed power budget Further the intelligent buffer chip or chips may also report thermal data to an intelligent register chip on the memory module. The intelligent buffer chip is able to make its own thermal decisions and steer, throttle, re-direct data or otherwise regulate memory behavior on the memory module at a finer level of control than is possible by using the memory controller alone.

Memory Failure Reporting

In a memory module that includes intelligent register and/or intelligent buffer chips, powerful memory failure reporting may be implemented.

For example, memory failure can be reported, even in computers that use memory controllers that do not support such a mechanism, by using the Error Correction Coding (ECC) signaling as described in this specification.

ECC signaling may be implemented by deliberately altering one or more data bits such that the ECC check in the memory controller fails.

Memory Access Pattern Reporting and Performance Control

The patterns of operations that occur in a memory system, such as reads, writes and so forth, their frequency distribution with time, the distribution of operations across memory modules, and the memory locations that are addressed, are known as memory system access patterns. In the current state of the art, it is usual for a computer designer to perform experiments across a broad range of applications to determine memory system access patterns and then design the memory controller of a computer in such a way as to optimize memory system performance. Typically, a few parameters that are empirically found to most affect the behavior and performance of the memory controller may be left as programmable so that the user may choose to alter these parameters to optimize the computer performance when using a particular computer application. In general, there is a very wide range of memory access patterns generated by different applications, and, thus, a very wide range of performance points across which the memory controller and memory system performance must be optimized. It is therefore impossible to optimize performance for all applications. The result is that the performance of the memory controller and the memory system may be far from optimum when using any particular application. There is currently no easy way to discover this fact, no way to easily collect detailed memory access patterns while running an application, no way to measure or infer memory system performance, and no way to alter, tune or in any way modify those aspects of the memory controller or memory system configuration that are programmable.

Typically a memory system that comprises one or more memory modules is further subdivided into ranks (typically a rank is thought of as a set of DRAM that are selected by a single chip select or CS signal), the DRAM themselves, and DRAM banks (typically a bank is a sub-array of memory cells inside a DRAM). The memory access patterns determine how the memory modules, ranks, DRAM chips and DRAM banks are accessed for reading and writing, for example. Access to the ranks, DRAM chips and DRAM banks involves turning on and off either one or more DRAM chips or portions of DRAM chips, which in turn dissipates power. This dissipation of power caused by accessing DRAM chips and portions of DRAM chips largely determines the total power dissipation in a memory system. Power dissipation depends on the number of times a DRAM chip has to be turned on or off or the number of times a portion of a DRAM chip has to be accessed followed by another portion of the same DRAM chip or another DRAM chip. The memory access patterns also affect and determine performance. In addition, access to the ranks, DRAM chips and DRAM banks involves turning on and off either whole DRAM chips or portions of DRAM chips, which consumes time that cannot be used to read or write data, thereby negatively impacting performance.

In the compute platforms used in many current embodiments, the memory controller is largely ignorant of the effect on power dissipation or performance for any given memory access or pattern of access.

In a memory module that includes intelligent register and/or intelligent buffer chips, however, powerful memory access pattern reporting and performance control capabilities may be implemented.

For example an intelligent buffer chip with an analysis block 590 that is connected directly to an array of DRAMs is able to collect and analyze information on DRAM address access patterns, the ratio of reads to writes, the access patterns to the ranks, DRAM chips and DRAM banks. This information may be used to control temperature as well as performance. Temperature and performance may be controlled by altering timing, power-down modes of the DRAM, and access to the different ranks and banks of the DRAM. Of course, the memory system or memory module may be subdivided in other ways.

Check Coding at the Byte Level

Typically, data protection and checking is provided by adding redundant information to a data word in a number of ways. In one well-known method, called parity protection, a simple code is created by adding one or more extra bits, known as parity bits, to the data word. This simple parity code is capable of detecting a single bit error. In another well-known method, called ECC protection, a more complex code is created by adding ECC bits to the data word. ECC protection is typically capable of detecting and correcting single-bit errors and detecting, but not correcting, double-bit errors. In another well-known method called ChipKill, it is possible to use ECC methods to correctly read a data word even if an entire chip is defective. Typically, these correction mechanisms apply across the entire data word, usually 64 or 128 bits (if ECC is included, for example, the data word may be 72 or 144 bits, respectively).

DRAM chips are commonly organized into one of a very few configurations or organizations. Typically, DRAMs are organized as x4, x8, or x16; thus, four, eight, or 16 bits are read and written simultaneously to a single DRAM chip.

In the current state of the art, it is difficult to provide protection against defective chips for all configurations or organizations of DRAM.

In a memory module that includes intelligent register and/or intelligent buffer, chips powerful check coding capabilities may be implemented.

Figure 6B:
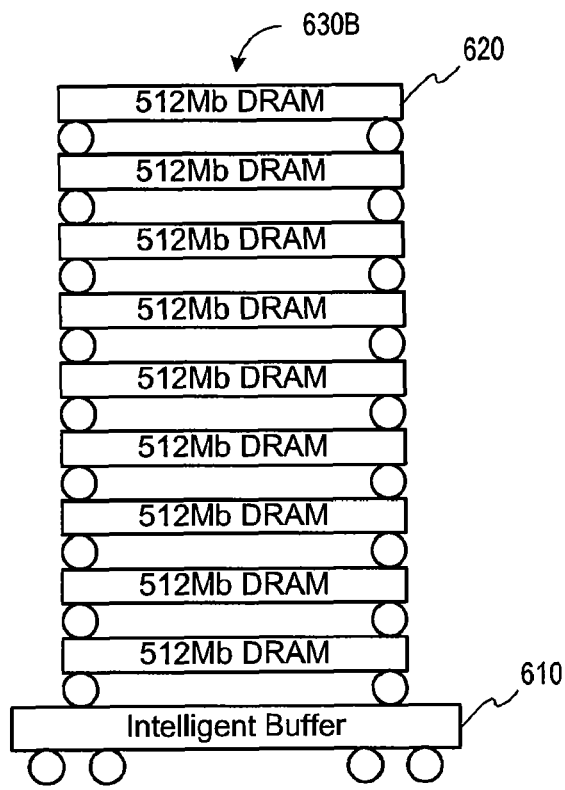
FIG. 6B depicts a memory stack in one embodiment with nine memory chips and one intelligent buffer.

For example, as shown in FIG. 6B, using an intelligent buffer chip 610 connected to a stack of x8 DRAMs 630B checking may be performed at the byte level (across 8 bits), rather than at the data word level. One possibility, for example, is to include a ninth DRAM 620, rather than eight DRAMs, in a stack and use the ninth DRAM for check coding purposes.

Other schemes can be used that give great flexibility to the type and form of the error checking. Error checking may not be limited to simple parity and ECC schemes, other more effective schemes may be used and implemented on the intelligent register and/or intelligent buffer chips of the memory module. Such effective schemes may include block and convolutional encoding or other well-known data coding schemes. Errors that are found using these integrated coding schemes may be reported by a number of techniques that are described elsewhere in this specification. Examples include the use of ECC Signaling.

Checkpointing

In High-Performance Computing (HPC), it is typical to connect large numbers of computers in a network, also sometimes referred to as a cluster, and run applications continuously for a very long time using all of the computers (possibly days or weeks) to solve very large numerical problems. It is therefore a disaster if even a single computer fails during computation.

One solution to this problem is to stop the computation periodically and save the contents of memory to disk. If a computer fails, the computation can resume from the last saved point in time. Such a procedure is known as checkpointing. One problem with checkpointing is the long period of time that it takes to transfer the entire memory contents of a large computer cluster to disk.

In a memory module that includes intelligent register and/or intelligent buffer chips, powerful checkpointing capabilities may be implemented.

For example, an intelligent buffer chip attached to stack of DRAM can incorporate flash or other non-volatile memory. The intelligent register and/or buffer chip can under external or autonomous command instigate and control the checkpointing of the DRAM stack to flash memory. Alternatively, one or more of the chips in the stack may be flash chips and the intelligent register and/or buffer chips can instigate and control checkpointing one or more DRAMs in the stack to one or more flash chips in the stack.

Figure 7A:
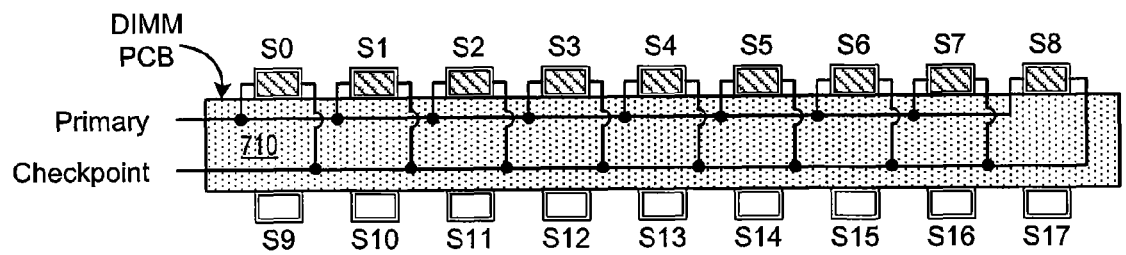
FIG. 7A depicts an embodiment of a DIMM implementing checkpointing.
Figure 7B:
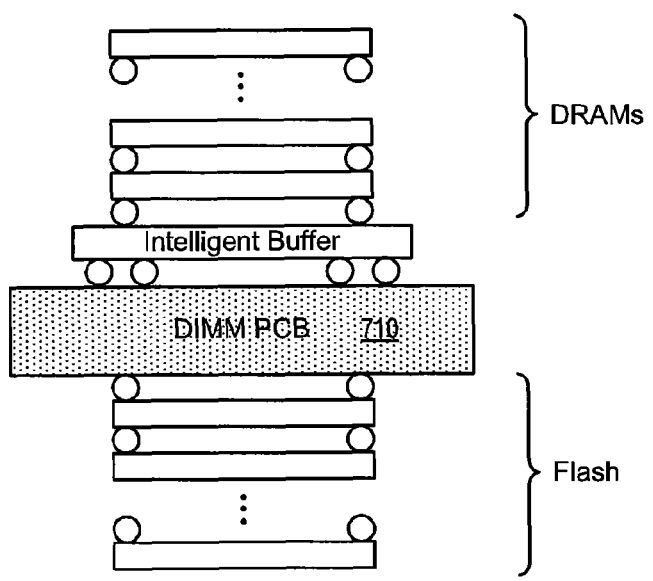
FIG. 7B depicts an depicts an exploded view of an embodiment of a DIMM implementing checkpointing.

In the embodiment shown in the views of FIG. 7A and FIG. 7B, the DIMM PCB 710 is populated with a stacks of DRAM S0-S8 on one side and stacks of flash S9-S17, on the other side, where each flash memory in a flash stack corresponds with one of the DRAM in the opposing DRAM stack. Under normal operation, the DIMM uses only the DRAM circuits— the flash devices may be unused, simply in a ready state. However, upon a checkpoint event, memory contents from the DRAMs are copied by the intelligent register and/or buffer chips to their corresponding Flash memories. In other implementations, the flash chips do not have to be in a stack orientation.

Read Retry Detection

In high reliability computers, the memory controller may supports error detection and error correction capabilities. The memory controller may be capable of correcting single-bit errors and detecting, but typically not correcting, double-bit errors in data read from the memory system. When such a memory controller detects a read data error, it may also be programmed to retry the read to see if an error still occurs. If the read data error does occur again, there is likely to be a permanent fault, in which case a prescribed path for either service or amelioration of the problem can be followed. If the error does not occur again, the fault may be transient and an alternative path may be taken, which might consist solely of logging the error and proceeding as normal. More sophisticated retry mechanisms can be used if memory mirroring is enabled, but the principles described here remain the same.

In a memory module that includes intelligent register and/or intelligent buffer chips, powerful read retry detection capabilities may be implemented. Such a memory module is also able to provide read retry detection capabilities for any computer, not just those that have a special-purpose and expensive memory controllers.

For example, the intelligent register and/or buffer chips can be programmed to look for successive reads to memory locations without an intervening write to that same location. In systems with a cache between the processor and memory system, this is an indication that the memory controller is retrying the reads as a result of seeing an error. In this fashion, the intelligent buffer and/or register chips can monitor the errors occurring in the memory module to a specific memory location, to a specific region of a DRAM chip, to a specific bank of a DRAM or any such subdivision of the memory module. With this information, the intelligent buffer and/or register chip can make autonomous decisions to improve reliability (such as making use of spares) or report the details of the error information back to the computer, which can also make decisions to improve reliability and serviceability of the memory system.

In some embodiments, a form of retry mechanism may be employed in a data communication channel. Such a retry mechanism is used to catch errors that occur in transmission and ask for an incomplete or incorrect transmission to be retried. The intelligent buffer and/or register chip may use this retry mechanism to signal and communicate to the host computer.

Hot-Swap and Hot-Plug

In computers used as servers, it is often desired to be able to add or remove memory while the computer is still operating. Such is the case if the computer is being used to run an application, such as a web server, that must be continuously operational. The ability to add or remove memory in this fashion is called memory hot-plug or hot-swap. Computers that provide the ability to hot-plug or hot-swap memory use very expensive and complicated memory controllers and ancillary hardware, such as latches, programmable control circuits, microcontrollers, as well as additional components such as latches, indicators, switches, and relays.

In a memory module that includes intelligent register and/or intelligent buffer chips, powerful hot-swap and hot plug capabilities may be implemented.

For example, using intelligent buffer and/or register chips on a memory module, it is possible to incorporate some or all of the control circuits that enable memory hot-swap in these chips.

Figure 8A:
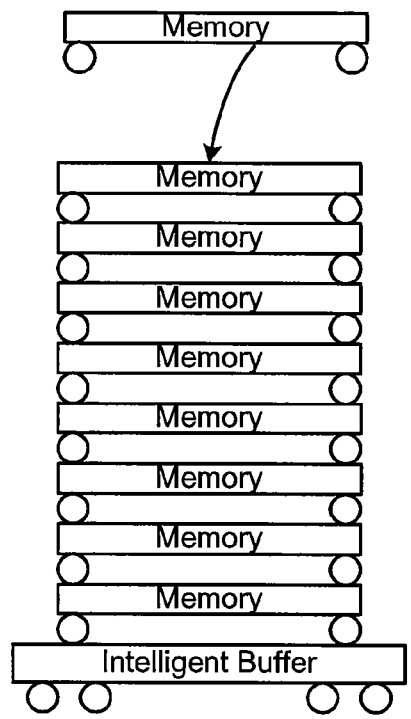
FIG. 8A depicts adding a memory chip to a memory stack.
Figure 8B:
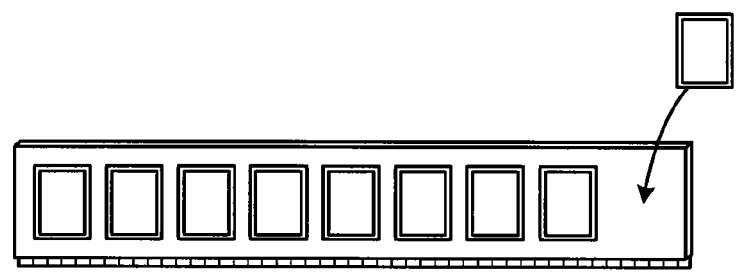
FIG. 8B depicts adding a memory stack to a DIMM.
Figure 8C:
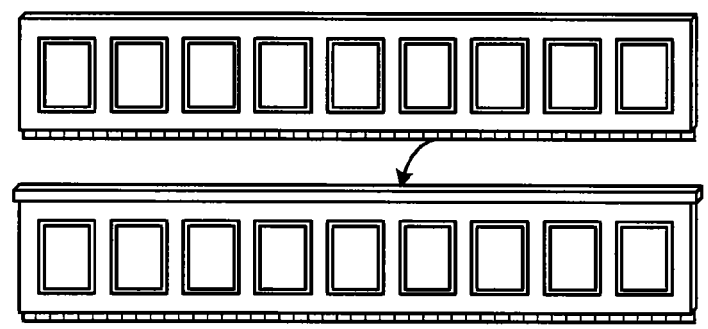
FIG. 8C depicts adding a DIMM to another DIMM.

In conventional memory systems, hot-swap is possible by adding additional memory modules. Using modules with intelligent buffer and/or intelligent register chips, hot-swap may be achieved by adding DRAM to the memory module directly without the use of expensive chips and circuits on the motherboard. In the embodiment shown in FIG. 8A, it is possible to implement hot-swap by adding further DRAMs to the memory stack. In another implementation as shown in FIG. 8B, hot-swap can be implemented by providing sockets on the memory module that can accept DRAM chips or stacks of DRAM chips (with or without intelligent buffer chips). In still another implementation as shown in FIG. 8C, hot-swap can be implemented by providing a socket on the memory module that can accept another memory module, thus allowing the memory module to be expanded in a hot-swap manner.

Redundant Paths

In computers that are used as servers, it is essential that all components have high reliability. Increased reliability may be achieved by a number of methods. One method to increase reliability is to use redundancy. If a failure occurs, a redundant component, path or function can take the place of a failure.

In a memory module that includes intelligent register and/or intelligent buffer chips, extensive datapath redundancy capabilities may be implemented.

For example, intelligent register and/or intelligent buffer chips can contain multiple paths that act as redundant paths in the face of failure. An intelligent buffer or register chip can perform a logical function that improves some metric of performance or implements some RAS feature on a memory module, for example. Examples of such features would include the Intelligent Scrubbing or Autonomous Refresh features, described elsewhere in this specification. If the logic on the intelligent register and/or intelligent buffer chips that implements these features should fail, an alternative or bypass path may be switched in that replaces the failed logic.

Autonomous Refresh

Most computers use DRAM as the memory technology in their memory system. The memory cells used in DRAM are volatile. A volatile memory cell will lose the data that it stores unless it is periodically refreshed. This periodic refresh is typically performed through the command of an external memory controller. If the computer fails in such a way that the memory controller cannot or does not institute refresh commands, then data will be lost.

In a memory module that includes intelligent register and/or intelligent buffer chips, powerful autonomous refresh capabilities may be implemented.

For example, the intelligent buffer chip attached to a stack of DRAM chips can detect that a required refresh operation has not been performed within a certain time due to the failure of the memory controller or for other reasons. The time intervals in which refresh should be performed are known and specific to each type of DRAM. In this event, the intelligent buffer chip can take over the refresh function. The memory module is thus capable of performing autonomous refresh.

Intelligent Scrubbing

In computers used as servers, the memory controller may have the ability to scrub the memory system to improve reliability. Such a memory controller includes a scrub engine that performs reads, traversing across the memory system deliberately seeking out errors. This process is called "patrol scrubbing" or just "scrubbing." In the case of a single-bit correctable error, this scrub engine detects, logs, and corrects the data. For any uncorrectable errors detected, the scrub engine logs the failure, and the computer may take further actions. Both types of errors are reported using mechanisms that are under configuration control. The scrub engine can also perform writes known as "demand scrub" writes or "demand scrubbing" when correctable errors are found during normal operation. Enabling demand scrubbing allows the memory controller to write back the corrected data after a memory read, if a correctable memory error is detected. Otherwise, if a subsequent read to the same memory location were performed without demand scrubbing, the memory controller would continue to detect the same correctable error. Depending on how the computer tracks errors in the memory system, this might result in the computer believing that the memory module is failing or has failed. For transient errors, demand scrubbing will thus prevent any subsequent correctable errors after the first error. Demand scrubbing provides protection against and permits detection of the deterioration of memory errors from correctable to uncorrectable.

In a memory module that includes intelligent register and/or intelligent buffer chips, more powerful and more intelligent scrubbing capabilities may be implemented.

For example, an intelligent register chip or intelligent buffer chip may perform patrol scrubbing and demand scrubbing autonomously without the help, support or direction of an external memory controller. The functions that control scrubbing may be integrated into intelligent register and/or buffer chips on the memory module. The computer can control and configure such autonomous scrubbing operations on a memory module either through inline or out-of-band communications that are described elsewhere in this specification.

Parity Protected Paths

In computers used as servers, it is often required to increase the reliability of the memory system by providing data protection throughout the memory system. Typically, data protection is provided by adding redundant information to a data word in a number of ways. As previously described herein, in one well-known method, called parity protection, a simple code is created by adding one or more extra bits, known as parity bits, to the data word. This simple parity code is capable of detecting a single bit error. In another well-known method, called ECC protection, a more complex code is created by adding ECC bits to the data word. ECC protection is typically capable of detecting and correcting single-bit errors and detecting, but not correcting, double-bit errors.

These protection schemes may be applied to computation data. Computation data is data that is being written to and read from the memory system. The protection schemes may also be applied to the control information, memory addresses for example, that are used to control the behavior of the memory system.

In some computers, parity or ECC protection is used for computation data. In some computers, parity protection is also used to protect control information as it flows between the memory controller and the memory module. The parity protection on the control information only extends as far as the bus between the memory controller and the memory module, however, as current register and buffer chips are not intelligent enough to extend the protection any further.

In a memory module that includes intelligent register and/or intelligent buffer chips, advanced parity protection coverage may be implemented.

Figure 9A:
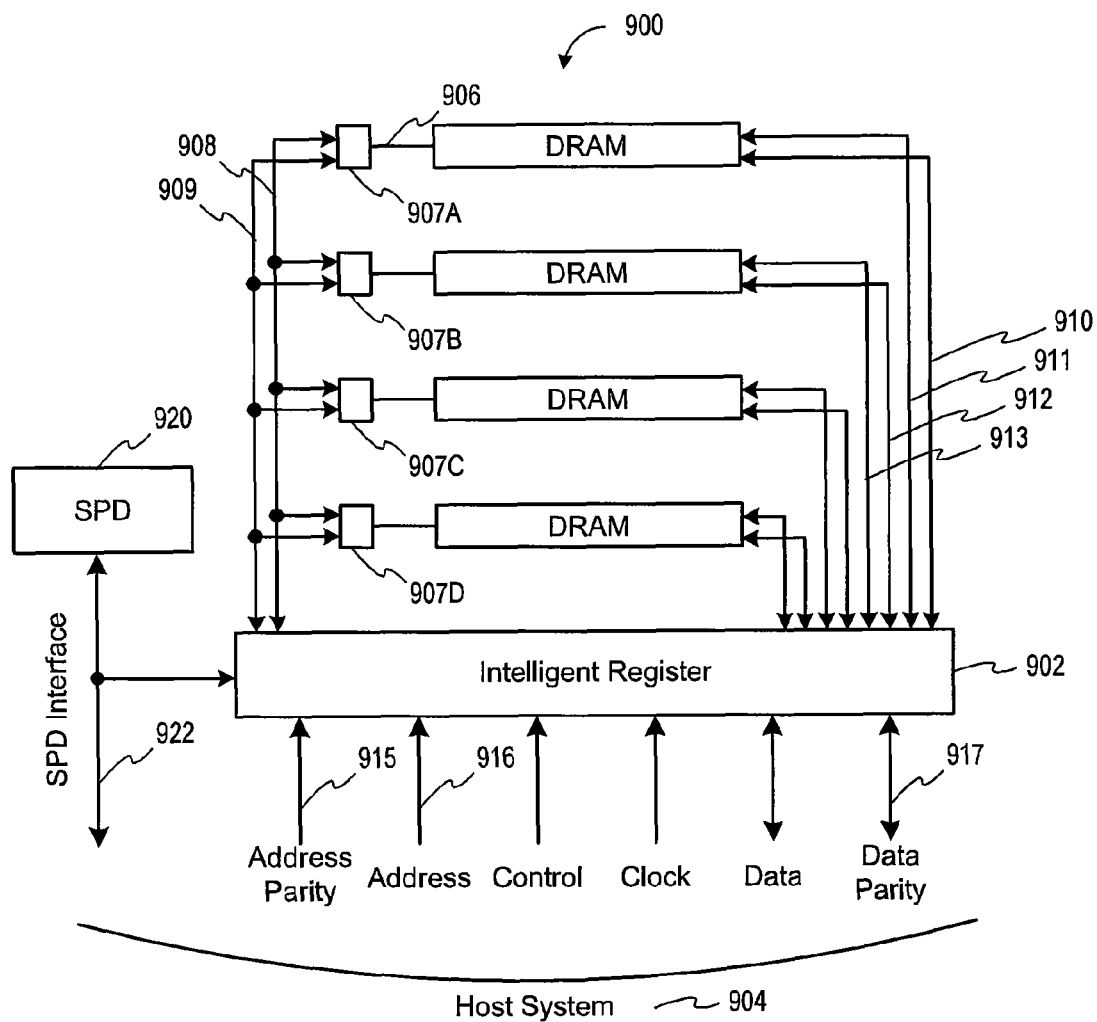
FIG. 9A depicts a memory subsystem that uses redundant signal paths.
Figure 9B:
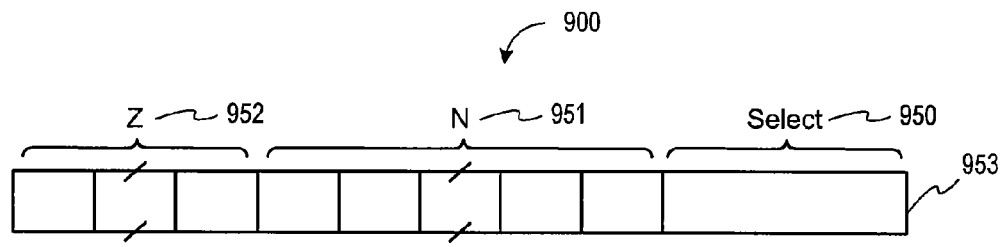
FIG. 9B a generalized bit field for communicating data.
Figure 9C:
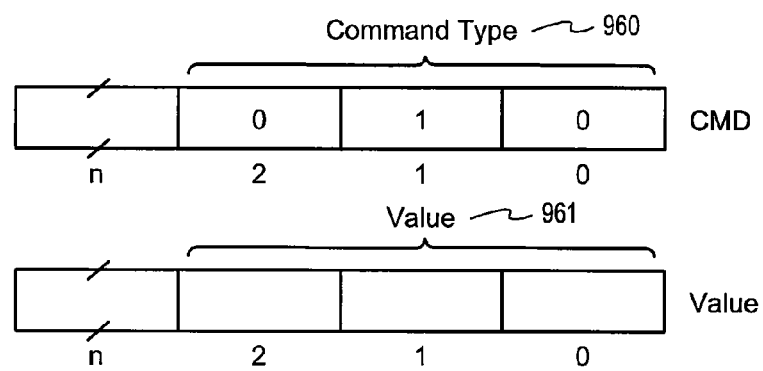
FIG. 9C depicts the bit field layout of a multi-cycle packet.

For example, as shown in FIG. 9A, a memory module that includes intelligent buffer and/or register chips, the control paths (those paths that involve control information, such as memory address, clocks and control signals and so forth) may be protected using additional parity signals to ECC protect any group of control path signals in part or in its entirety. Address parity signals 915 computed from the signals of the address bus 916, for example, may be carried all the way through the combination of any intelligent register 902 and/or intelligent buffer chips 907A-907D, including any logic functions or manipulations that are applied to the address or other control information.

Although the intelligent buffer chips 907A-907D are shown in FIG. 9A as connected directly to the intelligent register chip 902 and to buffer signals from the intelligent register chip, the same or other intelligent buffer chips may also be connected to buffer the data signals. The data signals may or may not be buffered by the intelligent register chip.

ECC Signaling

The vast majority of computers currently use an electrical bus to communicate with their memory system. This bus typically uses one of a very few standard protocols. For example, currently computers use either Double-Data Rate (DDR) or Double-Date Rate 2 (DDR2) protocols to communicate between the computer's memory controller and the DRAM on the memory modules that comprise the computer's memory system. Common memory bus protocols, such as DDR, have limited signaling capabilities. The main purpose of these protocols is to communicate or transfer data between computer and the memory system. The protocols are not designed to provide and are not capable of providing a path for other information, such as information on different types of errors that may occur in the memory module, to flow between memory system and the computer.

It is common in computers used as servers to provide a memory controller that is capable of detecting and correcting certain types of errors. The most common type of detection and correction uses a well-known type of Error Correcting Code (ECC). The most common type of ECC allows a single bit error to be detected and corrected and a double-bit error to be detected, but not corrected. Again, the ECC adds a certain number of extra bits, the ECC bits, to a data word when it is written to the memory system. By examining these extra bits when the data word is read, the memory controller can determine if an error has occurred.

In a memory module that includes intelligent register and/or intelligent buffer chips, a flexible error signaling capability may be implemented.

For example, as shown in FIG. 9, if an error occurs in the memory module, an intelligent register and/or buffer chip may deliberately create an ECC error on the data parity signals 917 in order to signal this event to the computer. This deliberate ECC error may be created by using a known fixed, hard-wired or stored bad data word plus ECC bits, or a bad data word plus ECC bits can be constructed by the intelligent register and/or buffer chip. Carrying this concept to a memory subsystem that includes one or more intelligent register chips and or one or more intelligent buffer chips, the parity signals 909, 911, and 913 are shown implemented for signals 908, 910, and 912. Such parity signals can be implemented optionally for all or some, or none of the signals of a memory module.

This signaling scheme using deliberate ECC errors can be used for other purposes. It is very often required to have the ability to request a pause in a bus protocol scheme. The DDR and other common memory bus protocols used today do not contain such a desirable mechanism. If the intelligent buffer chips and/or register chips wish to instruct the memory controller to wait or pause, then an ECC error can be deliberately generated. This will cause the computer to pause and then typically retry the failing read. If the memory module is then able to proceed, the retried read can be allowed to proceed normally and the computer will then, in turn, resume normal operation.

Sideband and Inline Signaling

Also, as shown in FIG. 9, a memory module that includes intelligent buffer and/or register chips, may communicate with an optional Serial Presence Detect (SPD) 920. The SPD may be in communication with the host through the SPD interface 922 and may be connected to any combination of any intelligent register 902 and/or any intelligent buffer chips 907A-907D. The aforementioned combination implements one or more data sources that can program and/or read the SPD in addition to the host. Such connectivity with the SPD provides the mechanism to perform communication between the host and memory module in order to transfer information about memory module errors (to improve Reliability and Serviceability features, for example). Another use of the SPD is to program the intelligent features of the buffer and/or register chips, such as latency, timing or other emulation features. One advantage of using the SPD as an intermediary to perform communication between intelligent buffer and/or register chips with the host is that a standard mechanism already exists to use the SPD and host to exchange information about standard memory module timing parameters.

The SPD is a small, typically 256-byte, 8-pin EEPROM chip mounted on a memory module. The SPD typically contains information on the speed, size, addressing mode and various timing parameters of the memory module and its component DRAMs. The SPD information is used by the computer's memory controller to access the memory module.

The SPD is divided into locked and unlocked areas. The memory controller (or other chips connected to the SPD) can write SPD data only on unlocked (write-enabled) DIMM EEPROMs. The SPD can be locked via software (using a BIOS write protect) or using hardware write protection. The SPD can thus also be used as a form of sideband signaling mechanism between the memory module and the memory controller.

In a memory module that includes intelligent register and/or intelligent buffer chips, extensive sideband as well as in-band or inline signaling capabilities may be implemented and used for various RAS functions, for example.

More specifically, the memory controller can write into the unlocked area of the SPD and the intelligent buffer and/or register chips on the memory module can read this information. It is also possible for the intelligent buffer and/or register chips on the memory module to write into the SPD and the memory controller can read this information. In a similar fashion, the intelligent buffer and/or register chips on the memory module can use the SPD to read and write between themselves. The information may be data on weak or failed memory cells, error, status information, temperature or other information.

An exemplary use of a communication channel (or sideband bus) between buffers or between buffers and register chips is to communicate information from one (or more) intelligent register chip(s) to one (or more) intelligent buffer chip(s).

In exemplary embodiments, control information communicated using the sideband bus 908 between intelligent register 902 and intelligent buffer chip(s) 907A-907D may include information such as the direction of data flow (to or from the buffer chips), and the configuration of the on-die termination resistance value (set by a mode register write command). As shown in the generalized example 900 of FIG. 9B, the data flow direction on the intelligent buffer chip(s) may be set by a "select port N, byte lane Z" command sent by the intelligent register via the sideband bus, where select 950 indicates the direction of data flow (for a read or a write), N 951 is the Port ID for one of the multiple data ports belonging to the intelligent buffer chip(s), and Z 952 would be either 0 or 1 for a buffer chip with two byte lanes per port. The bit field 953 is generalized for illustration only, and any of the fields 950, 951, 952 may be used to carry different information, and may be shorter or longer as required by the characteristics of the data.

The intelligent register chip(s) use(s) the sideband signal to propagate control information to the multiple intelligent buffer chip(s). However, there may be a limited numbers of pins and encodings used to deliver the needed control information. In this case, the sideband control signals may be transmitted by intelligent register(s) to intelligent buffer chip(s) in the form of a fixed-format command packet. Such a command packet be may two cycles long, for example. In the first cycle, a command type 960 may be transmitted. In the second cycle, the value 961 associated with the specific command may be transmitted. In one embodiment, the sideband command types and encodings to direct data flow or to direct Mode Register Write settings to multiple intelligent buffer chip(s) can be defined as follows (as an example, the command encoding for the command type 960 for presentation on the sideband bus in the first cycle is shown in parenthesis):

Null operation, NOP (000)
Read byte-lane 0 (001)
Write byte-lane 0 (010)
Update Mode Register Zero MR0 (011)
Write to both byte lanes 0 and 1 (100)
Read byte-lane 1 (101)
Write byte-lane 1 (110)
Update Extended Mode Register One EMR1 (111)

The second cycle contains values associated with the command in the first cycle.

Figure 9D:
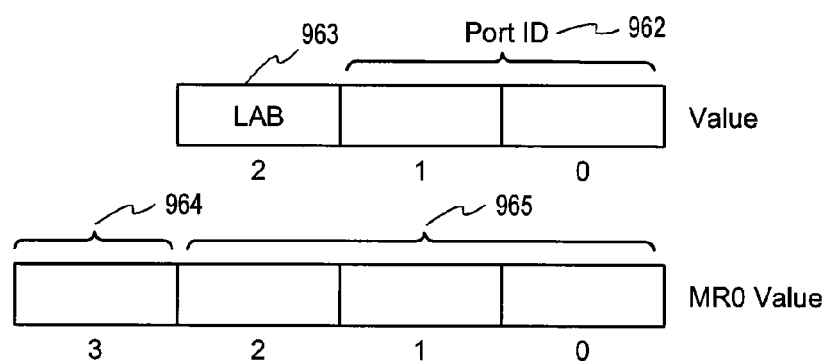
FIG. 9D depicts examples of bit fields for communicating data.

There may be many uses for such signaling. Thus, for example, as shown in FIG. 9D if the bi-directional multiplexer/de-multiplexer on intelligent buffer chip(s) is a four-port-to-one-port structure, the Port IDs would range from 0 to 3 to indicate the path of data flow for read operations or write operations. The Port IDs may be encoded as binary values on the sideband bus as Cmd[1:0] 962 in the second cycle of the sideband bus protocol (for read and write commands).

Other uses of these signals may perform additional features. Thus, for example, a look-aside buffer (or LAB) may used to allow the substitution of data from known-good memory bits in the buffer chips for data from known-bad memory cells in the DRAM. In this case the intelligent buffer chip may have to be informed to substitute data from a LAB. This action may be performed using a command and data on the sideband bus as follows. The highest order bit of the sideband bus Cmd[2] 963 may used to indicate a LAB. In the case that the sideband bus Cmd[2] may indicate a LAB hit on a read command, Intelligent buffer chip(s) may then take data from a LAB and drive it back to the memory controller. In the case that the sideband bus Cmd[2] indicates a LAB hit on a write command, Intelligent buffer chip(s) may take the data from the memory controller and write it into the LAB. In the case that the sideband bus Cmd[2] does not indicate a LAB hit, reads and writes may be performed to DRAM devices on the indicated Port IDs.

Still another use as depicted in FIG. 9D of the sideband signal may be to transfer Mode Register commands sent by the memory controller to the proper destination, possibly with (programmable) modifications. In the above example command set, two commands have been set aside to update Mode Registers.

One example of such a register mode command is to propagate an MR0 command, such as burst ordering, to the intelligent buffer chip(s). For example, Mode Register MR0 bit A[3] 964 sets the Burst Type. In this case the intelligent register(s) may use the sideband bus to instruct the intelligent buffer chip(s) to pass the burst type (through the signal group 906) to the DRAM as specified by the memory controller. As another example, Mode Register MR0 bit A[2:0] sets the Burst Length 965. In this case, in one configuration of memory module, the intelligent register(s) may use the sideband bus to instruct the intelligent buffer chip(s) to always write '010 (corresponding to a setting of burst length equal to four or BL4) to the DRAM. In another configuration of memory module, if the memory controller had asserted '011, then the intelligent register(s) must emulate the BL8 column access with two BL4 column accesses.

In yet another example of this type sideband bus use, the sideband bus may be used to modify (possibly under programmable control) the values to be written to Mode Registers. For example, one Extended Mode Register EMR1 command controls termination resistor values. This command sets the Rtt (termination resistor) values for ODT (on-die termination), and in one embodiment the intelligent register chip(s) may override existing values in the A[6] A[2] bits in EMR1 with '00 to disable ODT on the DRAM devices, and propagate the expected ODT value to the intelligent buffer chip(s) via the sideband bus.

In another example, the sideband signal may be used to modify the behavior of the intelligent buffer chip(s). For example, the sideband signal may be used to reduce the power consumption of the intelligent buffer chip(s) in certain modes of operation. For example, another Extended Mode Register EMR1 command controls the behavior of the DRAM output buffers using the Qoff command. In one embodiment, the intelligent register chip(s) may respect the Qoff request meaning the DRAM output buffers should be disabled. The intelligent register chip(s) may then pass through this EMR1 Qoff request to the DRAM devices and may also send a sideband bus signal to one or more of the intelligent buffer chip(s) to turn off their output buffers also—in order to enable IDD measurement or to reduce power for example. When the Qoff bit it set, the intelligent register chip(s) may also disable all intelligent buffer chip(s) in the system.

Additional uses envisioned for the communication between intelligent registers and intelligent buffers through side-band or inline signaling include:
  a. All conceivable translation and mapping functions performed on the Data coming into the Intelligent Register 902. A 'function' in this case should go beyond merely repeating input signals at the outputs.
  b. All conceivable translation and mapping functions performed on the Address and Control signals coming into the Intelligent Register 902. A 'function' in this case should go beyond merely repeating input signals at the outputs.
  c. Uses of any and every signal originating from the DRAM going to the Intelligent Register or intelligent buffer.
  d. Use of any first signal that is the result of the combination of a second signal and any data stored in non-volatile storage (e.g. SPD) where such first signal is communicated to one or more intelligent buffers 907.
  e. Clock and delay circuits inside the Intelligent Register or intelligent buffer. For example, one or more intelligent buffers can be used to de-skew data output from the DRAM.

Still more uses envisioned for the communication between intelligent registers and intelligent buffers through sideband or inline signaling include using the sideband as a time-domain multiplexed address bus. That is, rather than routing multiple physical address busses from the intelligent register to each of the DRAMs (through an intelligent buffer), a single physical sideband shared between a group of intelligent buffers can be implemented. Using a multi-cycle command & value technique or other intelligent register to intelligent buffer communication techniques described elsewhere in this specification, a different address can be communicated to each intelligent buffer, and then temporally aligned by the intelligent buffer such that the data resulting from (or presented to) the DRAMs is temporally aligned as a group.

Bypass and Data Recovery

In a computer that contains a memory system, information that is currently being used for computation is stored in the memory modules that comprise a memory system. If there is a failure anywhere in the computer, the data stored in the memory system is at risk to be lost. In particular, if there is a failure in the memory controller, the connections between memory controller and the memory modules, or in any chips that are between the memory controller and the DRAM chips on the memory modules, it may be impossible to retain and retrieve data in the memory system. This mode of failure occurs because there is no redundancy or failover in the datapath between the memory controller and DRAM. A particularly weak point of failure in a typical DIMM lies in the register and buffer chips that pass information to and from the DRAM chips. For example, in an FB-DIMM, there is an AMB chip. If the AMB chip on an FB-DIMM fails, it is not possible to retrieve data from the DRAM on that FB-DIMM.

In a memory module that includes intelligent register and/or intelligent buffer chips, more powerful memory buffer bypass and data recovery capabilities may be implemented.

As an example, in a memory module that uses an intelligent buffer or intelligent register chip, it is possible to provide an alternative memory datapath or read mechanism that will allow the computer to recover data despite a failure. For example, the alternative datapath can be provided using the SMBus or I2C bus that is typically used to read and write to the SPD on the memory module. In this case the SMBus or I2C bus is also connected to the intelligent buffer and/or register chips that are connected to the DRAM on the memory module. Such an alternative datapath is slower than the normal memory datapath, but is more robust and provides a mechanism to retrieve data in an emergency should a failure occur.

In addition, if the memory module is also capable of autonomous refresh, which is described elsewhere in this specification, the data may still be retrieved from a failed or failing memory module or entire memory system, even under conditions where the computer has essentially ceased to function, due to perhaps multiple failures. Provided that power is still being applied to the memory module (possibly by an emergency supply in the event of several failures in the computer), the autonomous refresh will keep the data in each memory module. If the normal memory datapath has also failed, the alternative memory datapath through the intelligent register and/or buffer chips can still be used to retrieve data. Even if the computer has failed to the extent that the computer cannot or is not capable of reading the data, an external device can be connect to a shared bus such as the SMBus or I2C bus used as the alternative memory datapath.

Control at Sub-DIMM Level

In a memory module that includes intelligent register and/or intelligent buffer chips, powerful temperature monitoring and control capabilities may be implemented, as described elsewhere in this specification. In addition, in a memory module that includes intelligent register and/or intelligent buffer chips, extensive control capabilities, including thermal and power control at the sub-DIMM level, that improve reliability, for example, may be implemented.

As an example, one particular DRAM on a memory module may be subjected to increased access relative to all the other DRAM components on the memory module. This increased access may lead to excessive thermal dissipation in the DRAM and require access to be reduced by throttling performance. In a memory module that includes intelligent register and/or intelligent buffer chips, this increased access pattern may be detected and the throttling performed at a finer level of granularity. Using the intelligent register and/or intelligent buffer chips, throttling at the level of the DIMM, a rank, a stack of DRAMs, or even an individual DRAM may be performed.

In addition, by using intelligent buffer and/or register chips, the throttling or thermal control or regulation may be performed. For example the intelligent buffer and/or register chips can use the Chip Select, Clock Enable, or other control signals to regulate and control the operation of the DIMM, a rank, a stack of DRAMs, or individual DRAM chips. Self-Test Memory modules used in a memory system may form the most expensive component of the computer. The largest current size of memory module is 4 GB (a GB or gigabyte is 1 billion bytes or 8 billion bits) and such a memory module costs several thousands of dollars. In a computer that uses several of these memory modules (it is not uncommon to have 64 GB of memory in a computer), the total cost of the memory may far exceed the cost of the computer.

In memory systems, it is thus exceedingly important to be able to thoroughly test the memory modules and not discard memory modules because of failures that can be circumvented or repaired.

In a memory module that includes intelligent register and/or intelligent buffer chips, extensive DRAM advanced self-test capabilities may be implemented.

For example, an intelligent register chip on a memory module may perform self-test functions by reading and writing to the DRAM chips on the memory module, either directly or through attached intelligent buffer chips. The self-test functions can include writing and reading fixed patterns, as is commonly done using an external memory controller. As a result of the self-test, the intelligent register chip may indicate success or failure using an LED, as described elsewhere in this specification. As a result of the self-test, the intelligent register or intelligent buffer chips may store information about the failures. This stored information may then be used to re-map or map out the defective memory cells, as described elsewhere in this specification.

While the foregoing is directed to embodiments of the present invention, other and further embodiments of the invention may be devised without departing from the basic scope thereof. For example, persons skilled in the art will appreciate that the features and functionalities described herein may be implemented using either an intelligent register chip, an intelligent buffer chip, both intelligent chips, or any combination thereof. The scope of the present invention is thereof determined by the claims that follow.

We claim:

1. A memory module, comprising:
   at least one memory chip; and
   a first intelligent chip coupled to the at least one memory chip and adapted to be coupled to a memory controller, wherein the first intelligent chip is configured to implement at least a part of a reliability and serviceability (RAS) feature; and
   a second intelligent chip coupled to the at least one memory chip and adapted to be coupled to the memory controller, and a sideband bus that couples the first intelligent chip to the second intelligent chip, wherein the second intelligent chip is configured to transmit a signal to the first intelligent chip to turn off an output buffer associated with the first intelligent chip.

2. The memory module of claim 1, wherein the first intelligent chip is configured to control a light-emitting diode to indicate a failure of the memory module.

3. The memory module of claim 1, wherein the RAS feature comprises a self-test performed on the memory module.

4. The memory module of claim 3, wherein the first intelligent chip is configured to control one or more light-emitting diodes to indicate a failed or successful self-test.

5. The memory module of claim 1, wherein the RAS feature comprises memory sparing.

6. The memory module of claim 5, wherein the first intelligent chip is configured to calculate replacement possibilities, optimize a replacement based on a replacement strategy, notify a host system of memory sparing operations being performed, and perform a memory sparing substitution or replacement.

7. The memory module of claim 1, wherein the RAS feature comprises memory mirroring.

8. The memory module of claim 1, wherein the RAS feature comprises memory redundant array of inexpensive disks (RAID) functionality.

9. The memory module of claim 1, wherein the RAS feature comprises memory defect remapping.

10. The memory module of claim 1, wherein the RAS feature comprises memory status and information reporting.

11. The memory module of claim 1, wherein the RAS feature comprises memory temperature monitoring.

12. The memory module of claim 1, wherein the RAS feature comprises thermal control functionality.

13. The memory module of claim 1, wherein the RAS feature comprises memory failure reporting.

14. The memory module of claim 1, wherein the RAS feature comprises memory access pattern gathering and reporting.

15. The memory module of claim 1, wherein the RAS feature comprises performance control functionality based on memory access patterns.

16. The memory module of claim 1, wherein the RAS feature comprises byte-level check coding.

17. The memory module of claim 1, wherein the RAS feature comprises checkpointing.

18. The memory module of claim 1, wherein the RAS feature comprises read retry detection.

19. The memory module of claim 1, wherein the RAS feature comprises hot-plug or hot-swap functionality.

20. The memory module of claim 1, further comprising at least one redundant data path to or from the first intelligent chip.

21. The memory module of claim 1, wherein the RAS feature comprises autonomous refresh functionality.

22. The memory module of claim 1, wherein the RAS feature comprises patrol or demand scrubbing.

23. The memory module of claim 1, wherein the first intelligent chip is configured to transmit or receive one or more parity-protected signals.

24. The memory module of claim 1, wherein the RAS feature comprises error correction code (ECC) signaling.

25. The memory module of claim 1, further comprising a serial presence detect (SPD) chip, and wherein the RAS feature comprises sideband signaling between the memory module and the memory controller using the SPD chip.

26. The memory module of claim 1, further comprising at least one alternative data path between the first intelligent chip and the at least one memory chip, and wherein the RAS feature comprises bypass and data recovery using the alternative data path.

27. The memory module of claim 1, wherein the RAS feature comprises thermal or power control functionality at a sub-memory module level.

28. The memory module of claim 1, wherein the memory module comprises a dual inline memory module (DIMM).

29. The memory module of claim 1, wherein the at least one memory chip comprises a stack of dynamic random access memory chips.

30. The memory module of claim 1, wherein the second intelligent chip is configured to implement another part of the RAS feature.

31. The memory module of claim 1, wherein the memory module is part of a memory subsystem.

32. The memory module of claim 1, wherein the memory module is coupled to a motherboard.

33. The memory module of claim 1, wherein the memory module is included in a computer system.

34. The memory module of claim 1, wherein the first intelligent chip is an intelligent buffer chip, and the second intelligent chip is an intelligent register chip.

35. The memory module of claim 1, wherein the sideband bus is configured to communicate control information, wherein the control information includes an indication of a data flow direction, at least one port identifier, and an indication of a number of byte lanes per port.

36. The memory module of claim 1, wherein the sideband bus is configured to communicate control information in the form of a fixed-format command packet.

37. The memory module of claim 36, wherein the command packet is two cycles long, a command type is transmitted in a first cycle, and a value associated with a command of the command type is transmitted in a second cycle.

38. The memory module of claim 1, wherein the sideband bus is configured to communicate information to configure a bi-directional multiplexer/de-multiplexer on the first intelligent chip or the second intelligent chip.

39. The memory module of claim 1, wherein the sideband bus is configured to communicate information to prompt the first intelligent chip or the second intelligent chip to use a look-aside buffer to substitute data from good memory bits in the at least one memory chip for data from known bad memory bits in the at least one memory chip.

40. The memory module of claim 1, wherein the sideband bus is configured to transfer mode register commands transmitted by the memory controller.

41. The memory module of claim 40, wherein the sideband bus is configured to modify one or more values previously written to one or more mode registers.

42. The memory module of claim 1, wherein the sideband bus is configured to communicate translation and mapping functions between the first intelligent chip and the second intelligent chip.

43. The memory module of claim 1, wherein the sideband bus is configured as a time-domain multiplexed address bus.

44. The memory module of claim 25, wherein the first intelligent chip and the second intelligent chip are configured to communicate through the SPD chip.

45. The memory module of claim 34, wherein the second intelligent chip is configured to modify a command that configures an on-die termination resistance value.

46. The memory module of claim 45, wherein the sideband bus is configured to communicate the command that configures the on-die termination resistance value.

47. The memory module of claim 34, wherein the first intelligent chip includes a bi-directional multiplexer/de-multiplexer.

48. The memory module of claim 47, wherein the sideband bus is configured to communicate control information that includes commands for controlling the bi-directional multiplexer/de-multiplexer.

49. The memory module of claim 48, wherein the bi-directional multiplexer/de-multiplexer is a four-port-to-one-port structure or a two-port-to-one-port structure.

50. The memory module of claim 34, wherein the sideband bus is configured to communicate control information that includes commands for controlling a direction of data flow to or from the first intelligent chip.

51. The memory module of claim 41, wherein the second intelligent chip is configured to modify a mode register command to configure an on-die termination resistance value.

* * * * *